(12) United States Patent
Kosaka et al.

(10) Patent No.: US 10,175,304 B2
(45) Date of Patent: Jan. 8, 2019

(54) POWER-SYSTEM SHORT-CIRCUIT CAPACITY MONITORING METHOD AND SYSTEM THEREOF

(71) Applicant: Kabushiki Kaisha Toshiba, Minato-ku (JP)

(72) Inventors: Yoko Kosaka, Nakano (JP); Takenori Kobayashi, Meguro (JP); Yoshiki Takabayashi, Yokohama (JP); Kazuya Omata, Uenohara (JP); Verma Suresh Chand, Nagoya (JP); Yoshihiko Wazawa, Kasugai (JP); Yoshiki Nakachi, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 767 days.

(21) Appl. No.: 14/390,814

(22) PCT Filed: Apr. 5, 2013

(86) PCT No.: PCT/JP2013/060435
§ 371 (c)(1),
(2) Date: Oct. 6, 2014

(87) PCT Pub. No.: WO2013/151154
PCT Pub. Date: Oct. 10, 2013

(65) Prior Publication Data
US 2015/0120228 A1 Apr. 30, 2015

(30) Foreign Application Priority Data
Apr. 6, 2012 (JP) .................................. 2012-087677

(51) Int. Cl.
*G01R 31/40* (2014.01)
*H02J 13/00* (2006.01)
(Continued)

(52) U.S. Cl.
CPC ............ *G01R 31/40* (2013.01); *G01R 27/16* (2013.01); *H02J 13/0006* (2013.01);
(Continued)

(58) Field of Classification Search
CPC .... G01R 31/40; G01R 27/16; G01R 19/2513; H02J 13/0006; Y02E 60/74; Y02E 60/728; Y04S 10/30; Y04S 10/265
See application file for complete search history.

(56) References Cited

U.S. PATENT DOCUMENTS

| 7,499,816 B2 | 3/2009 | Scholtz et al. |
| 2008/0140326 A1 | 6/2008 | Scholtz et al. |

FOREIGN PATENT DOCUMENTS

| CN | 101510694 A | 8/2009 |
| CN | 101534021 A | 9/2009 |

(Continued)

OTHER PUBLICATIONS

International Search Report dated Jun. 11, 2013, in PCT/JP2013/060435.
(Continued)

*Primary Examiner* — Huan Tran
(74) *Attorney, Agent, or Firm* — Oblon, McClelland, Maier & Neustadt, L.L.P.

(57) ABSTRACT

Synchronous measuring terminals 5 synchronously measure phasor quantity D101 of a voltage/current at respective measurement points 1 and 2. A data-set creating block 91 of a short-circuit capacity monitoring device 7 creates, for each measurement cycle Δt, a data set D102 containing n pieces of data based on the phasor quantities D101 of voltage and current. A phase correcting block 92 performs a phase correction on the phasor quantity using the data set D102 to
(Continued)

create a data set D102', and a backward impedance estimating block 93 estimates a backward impedance D103 using the data set D102'.

17 Claims, 22 Drawing Sheets

(51) Int. Cl.
  *G01R 27/16* (2006.01)
  *G01R 19/25* (2006.01)
(52) U.S. Cl.
  CPC ......... *G01R 19/2513* (2013.01); *Y02E 60/728* (2013.01); *Y02E 60/74* (2013.01); *Y04S 10/265* (2013.01); *Y04S 10/30* (2013.01)

(56) References Cited

FOREIGN PATENT DOCUMENTS

| CN | 101573852 A | 11/2009 |
| CN | 101789598 A | 7/2010 |
| JP | 4-265631 | 9/1992 |
| JP | 6-161576 | 6/1994 |
| JP | 2012090398 A * | 5/2012 |
| WO | WO 2010/083164 A2 | 7/2010 |
| WO | WO 2010/083164 A3 | 7/2010 |

OTHER PUBLICATIONS

Kohzo Aratame, "Application of Power System Technology Calculation", Denkishoin Co., Ltd., Chapter 5, Jun. 1, 1981, pp. 121-194.

Kohzo Aratame, "Application of Power System Technology Calculation", Denkishoin Co., Ltd., Chapter 9, Jun. 1, 1981, pp. 401-402.

Extended European Search Report dated Nov. 27, 2015 in Patent Application No. 13773133.7.

Combined Chinese Office Action and Search Report dated Feb. 23, 2016 in Patent Application No. 201380018112.3 (with partial English translation and English translation of categories of cited documents).

Lei Huang, et al., "Online Monitoring of Wide-area Voltage Stability Based on Short Circuit Capacity," Power and Energy Engineering Conference, XP031939087, (2011), 5 pages.

Benjamin Genet, et al., "Voltage-Stability Monitoring Using Wide-Area Measurement Systems," Power Tech, XP031269634, (2007), pp. 1712-1717.

Qin Yun, et al., "Application analysis on voltage stability index based on the short-circuit capacity in Hubei Power Grid," Power and Energy Engineering Conference, XP032240116, (2012), 4 pages.

* cited by examiner

DATA SET DISTRIBUTION
IN A CASE SYSTEM TINY
FLUCTUATION IS LARGE

CHANGE WITH TIME IN
A CASE SYSTEM TINY
FLUCTUATION IS LARGE

DATA SET DISTRIBUTION
IN A CASE SYSTEM TINY
FLUCTUATION IS SMALL

CHANGE WITH TIME IN
A CASE SYSTEM TINY
FLUCTUATION IS
SMALL

IN A CASE THERE IS NO OUTLIER IN DISTRIBUTION OF DATA SET

IN A CASE THERE IS OUTLIER IN DISTRIBUTION OF DATA SET

CHANGE WITH TIME IN REPRESENTATIVE VALUE
OF SHORT-CIRCUIT CAPACITY ESTIMATION RESULT
IN A CASE THERE IS NO OUTLIER IN SHORT-
CIRCUIT CAPACITY CALCULATION RESULT

SHORT-CIRCUIT CAPACITY
IN A CASE THERE IS NO OUTLIER IN SHORT-
CIRCUIT CAPACITY CALCULATION RESULT

CHANGE WITH TIME IN REPRESENTATIVE VALUE
OF SHORT-CIRCUIT CAPACITY ESTIMATION RESULT
IN A CASE THERE IS OUTLIER IN SHORT-CIRCUIT
CAPACITY CALCULATION RESULT

DISTRIBUTION FOR CERTAIN TIME PERIOD IN
A CASE THERE IS OUTLIER IN SHORT-CIRCUIT
CAPACITY CALCULATION RESULT

RELATIONSHIP BETWEEN SHORT-CIRCUIT CURRENT ESTIMATED VALUE AND VOLTAGE MAGNITUDE FLUCTUATION WIDTH

HISTOGRAM OF VOLTAGE MAGNITUDE FLUCTUATION WIDTH

POWER-SYSTEM SHORT-CIRCUIT CAPACITY MONITORING METHOD AND SYSTEM THEREOF

CROSS-REFERENCE TO RELATED APPLICATIONS

This application is based upon and claims the benefit of priority from Japanese Patent Application No. 2012-087677, filed on Apr. 6, 2012, the entire contents of which are incorporated herein by reference.

TECHNICAL FIELD

The present disclosure relates to a power-system short-circuit capacity monitoring method and a system thereof which can measure a short-circuit capacity in accordance with an actual condition.

BACKGROUND ART

When a short-circuit fault occurs in a power system, a short-circuit current flows from a power generator connected to the system to a short-circuit point. A value obtained by multiplying the short-circuit current by a line-to-line voltage is a short-circuit capacity, and the short-circuit capacity tends to increase in recent power systems. This is because a large-scale power source is non-uniformly located in a basic system, and introduction of a distributed power source is advancing in the lower-level system.

When the short-circuit capacity of the power system increases, the short-circuit current flowing at the time of a system failure increases, and may exceed the rated breaking capacity. In this case, the co-existing breaker may be replaced with a higher-level rated breaker, but it brings about an increase of costs. Hence, technologies are proposed which employ a high-impedance device and a current-limiting reactor, and which divide the system to suppress a short-circuit capacity of the power system.

Among those technologies, a division of a system is quite effective to suppress a short-circuit capacity. More specifically, a scheme of always dividing the system, a scheme of introducing a new high-order system voltage to divide the co-existing system, and a scheme of dividing an AC system by a DC interconnection (BTB: Back To Back) are known so far.

However, when a divisional operation of the system is carried out to suppress the short-circuit capacity of the power system, the system operation becomes inevitably non-flexible, and thus the advantages of a system interconnection may be lost. That is, in order to maintain the flexibility of the system operation, it is desirable that the divisional operation of the system should be suppressed as minimum as possible.

In order to do so, it is necessary to precisely know the short-circuit capacity. When the precise short-circuit capacity is known, a flexible system operation and a selection of a set value of a protection relay in accordance with an actual condition are enabled. That is, from the standpoint of a system protection, it is important to know the short-circuit capacity.

However, the short-circuit capacity of a power system has the magnitude and the distribution continuously changing depending on various factors, such as a condition of a system configuration when a short-circuit failure occurs (e.g., a system switching in a higher-rank system), the number of power generators connected in parallel, the location of the short-circuit point, and the kind of the failure.

It is difficult to directly measure the short-circuit capacity of the power system. Hence, according to the conventional technologies, the short-circuit capacity is calculated based on preset constants of system facilities, such as a power line constituting the system, a transformer, and a power generator (see, for example, Non-patent Document 1). When, however, the constants of system facilities are applied, it is necessary to perform calculation with all power-generator parallel connection condition and system configurations being reflected. Hence, it requires a lot of works and time. In addition, the value obtained through the calculation contains unclarity in the precondition of the calculation and the constants. As a measurement scheme of the short-circuit capacity, an indirect power-system short-circuit capacity measuring scheme is general. For example, the short-circuit capacity is indirectly obtained based on the measured value of a voltage fluctuation rate inherent to a loading of a power capacitor or a shunt reactor (see Non-patent Document 2).

RELATED TECHNICAL DOCUMENTS

Non-Patent Document

Non-patent Document 1: Kohzo ARATAME, "Application of Power System Technology Calculation", Denkishoin Co., Ltd., Chapter 5, p. 121-194

Non-patent Document 2: Kohzo ARATAME, "Application of Power System Technology Calculation", Denkishoin Co., Ltd., Chapter 9, p. 401-402

However, as explained above, the short-circuit capacity of the power system continuously changes depending on the condition of the system configuration, etc. Hence, it is difficult to strictly obtain the short-circuit capacity in accordance with an actual condition, and the following problems have been pointed out to the aforementioned conventional technologies. That is, like the Non-patent Document 1, when the short-circuit capacity is obtained through a calculation using the constants of the system facilities, it is difficult to evaluate whether or not the calculation result reflects the actual condition of the system.

In addition, like the Non-patent Document 2, according to the simple calculation scheme that indirectly calculates the short-circuit capacity based on the measured value of the voltage fluctuation rate, the short-circuit capacity is calculated based on a loading timing of a power capacitor or a shunt reactor. Hence, it is difficult to measure the short-circuit capacity for a desired cross-section.

Meanwhile, in a power system, the system frequency changes from one time to another in a stationary condition. That is, when a time at which a measurement is performed differs, the system frequency changes. Hence, when it is attempted to calculate the short-circuit capacity using measured data at multiple time points, a change in the system frequency affects the calculation result of the short-circuit capacity. Hence, it is difficult to precisely calculate the short-circuit capacity in accordance with an actual condition using pieces of data at multiple time points.

The present disclosure has been made to address the aforementioned technical problems, and it is an objective of the present disclosure to provide a power-system short-circuit capacity monitoring method and a system in which data is corrected to eliminate a change in a system frequency with a time using plural pieces of data measured over time synchronously at multiple measurement points, and thus a short-circuit capacity in accordance with an actual condition in a desired cross-section can be grasped and monitored.

SUMMARY

To accomplish the above objective, a method for monitoring a short-circuit capacity of a power system according to the present disclosure includes following steps (a) to (f).

(a) A data measuring step for synchronously measuring, with time, a phasor quantity of a voltage and a current at each of at least two measurement points through a power line of the power system, and a phasor quantity of a voltage at a measurement point for a phase correction connected to the measurement points through the power line of the power system.

(b) A data collecting step for collecting measured data measured through the data measuring step.

(c) A data-set creating step for creating, for each predetermined cycle, a data set containing a plural pieces of data based on the measured data collected through the data collecting step.

(d) A phase correcting step for correcting a phase of the data set by subtracting a voltage phase of the measurement point for the phase correction from each phase of the data set, defining a voltage phase at an arbitrary time and at an arbitrary measurement point as a reference phase, and subtracting the reference phase from each phase of the data set.

(e) A backward impedance estimating step for estimating a backward impedance when a power-source side is viewed from a short-circuit point using the data set having undergone the phase correction through the phase correcting step.

(f) A short-circuit capacity calculating step for calculating a short-circuit capacity based on the backward impedance estimated through the backward impedance estimating step.

According to the power-system short-circuit capacity monitoring method, the phasor quantity of voltage and current are synchronously measured at multiple measurement points, the phasor quantity of voltage is measured at a measurement point for a phase correction, a change in the phase is corrected to eliminate an adverse effect due to a change with time in the system frequency, and then a backward impedance is estimated and calculated based on multiple pieces of synchronous measured data. Hence, it becomes possible to calculate a short-circuit capacity in accordance with an actual condition based on the estimated backward impedance, and thus a precise short-circuit capacity can be grasped and monitored.

BRIEF DESCRIPTION OF DRAWINGS

FIGS. 17A, 17B are graphs for explaining a case in which a system tiny fluctuation is large according to a third embodiment of the present disclosure, in which FIG. 17A is a distribution diagram of a phasor quantity of an estimation data set, and FIG. 17B is a conceptual diagram of a change with time;

FIGS. 18A, 18B are graphs for explaining a case in which a system tiny fluctuation is small in the third embodiment, in which FIG. 18A is a distribution diagram of a phasor quantity of an estimation data set, and FIG. 18B is a conceptual diagram of a change with time;

FIGS. 21A, 21B are graphs for explaining a fifth embodiment of the present disclosure when measured short-circuit capacities have no outlier, in which FIG. 21A is a calculation result of a short-circuit capacity time by time, and FIG. 21B is a graph indicating a distribution of short-circuit capacities for a certain time period;

DETAILED DESCRIPTION

Figure 1:
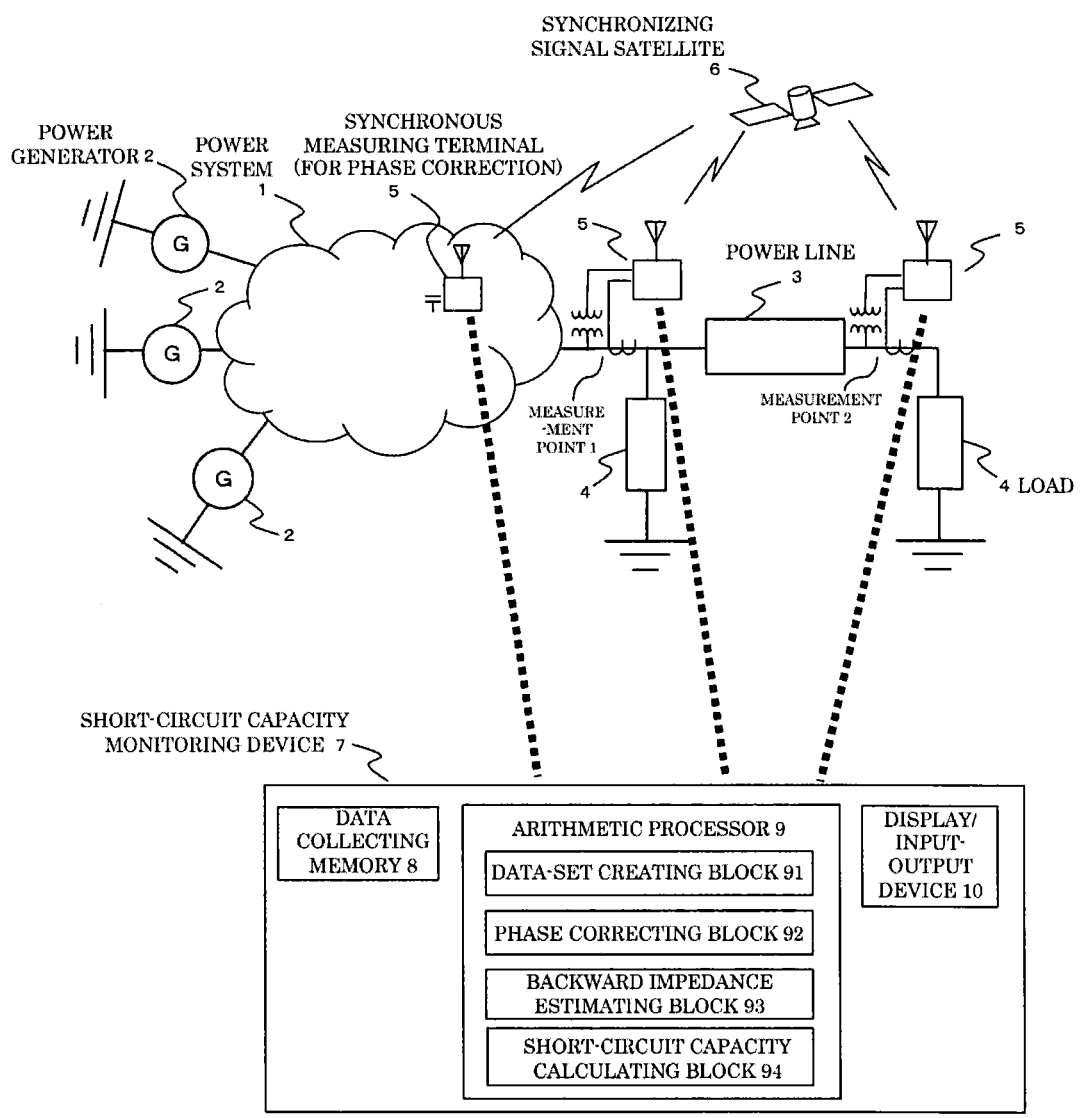
FIG. 1 is a configuration diagram for a first embodiment of the present disclosure.

Example embodiments of the present disclosure will be explained below in detail with reference to the accompanying drawings. The same structure in respective embodiments will be denoted by the same reference numeral, and the duplicated explanation thereof will be omitted.

(1) First Embodiment
[Configuration]

A first embodiment of the present disclosure will be explained with reference to FIG. 1. The first embodiment relates to a system that monitors a short-circuit capacity in a power system 1, and FIG. 1 is a configuration diagram of the first embodiment. As illustrated in FIG. 1, the power system 1 is connected with multiple power generators 2, and multiple loads 4 are connected via power lines 3. Synchronous measuring terminals 5 are respectively provided at the connecting nodes of the loads 4 and at a measurement point for phase correction. The measurement point for phase correction is a selected location having a small fluctuation relative to the load fluctuation at the measurement point in the power system 1. When, for example, measurement is carried out with a 77-kV bus line, a 275-kV bus line is selected as the measurement point for phase correction.

In FIG. 1, reference numeral 6 indicates a synchronizing signal satellite. The synchronizing signal satellite 6 transmits, as a synchronizing signal, a GPS (Global Positioning System) signal to the synchronous measuring terminal 5. The synchronous measuring terminal 5 synchronously measures the phasor quantity of a line-to-line voltage at the connecting nodes of the load 4 and the phasor quantity of a line-to-line current with time using the synchronizing signal transmitted from the synchronizing signal satellite 6. In addition, the synchronous measuring terminal 5 synchronously measures the phasor quantity of a line-to-line voltage at a phase correction measurement point with time using the synchronizing signal transmitted from the synchronizing signal satellite 6. In the following explanation, "voltage" and "current" mean "line-to-line voltage" and "line-to-line current", respectively, and the phasor quantity of the voltage and that of the current is data relating to the magnitude and phase of the voltage and those of the current.

The synchronous measuring terminal 5 is built with a PMU (Phasor Measurement Unit). The PMU receives the GPS signal from the synchronizing signal satellite 6 at a predetermined measurement cycle, realizes highly precise synchronous measurement of the phasor quantity using the received GPS signal as a synchronizing signal, and outputs measured data (as to a phasor communication standard, see IEEE Standard C37. 118-2005). In addition, each synchronous measuring terminal 5 is provided with communication means that transmits the phasor quantities of the voltage and the current as the measured data.

In the short-circuit capacity monitoring system of the first embodiment, the synchronous measuring terminal 5 and the synchronizing signal satellite 6 constitute a data measurer, and a short-circuit capacity monitoring device 7 constitutes the major part of this system. The short-circuit monitoring device 7 is connected with each synchronous measuring terminal 5 via communication means, and is built with block having the following functions. That is, the short-circuit monitoring device 7 is provided with a data collecting memory 8 that collects and stores measured data from each synchronous measuring terminal 5, an arithmetic processor 9 that performs calculation to obtain the short-circuit capacity based on measured data, and a display/input-output device 10 which sets parameters and displays a process result. The arithmetic processor 9 of the short-circuit monitoring device 7 is provided with, as functional blocks for an arithmetic processing, a data-set creating block 91, a phase correcting block 92, a backward impedance estimating block 93, and a short-circuit capacity calculating block 94.

[Whole Process Flow]

Figure 2:
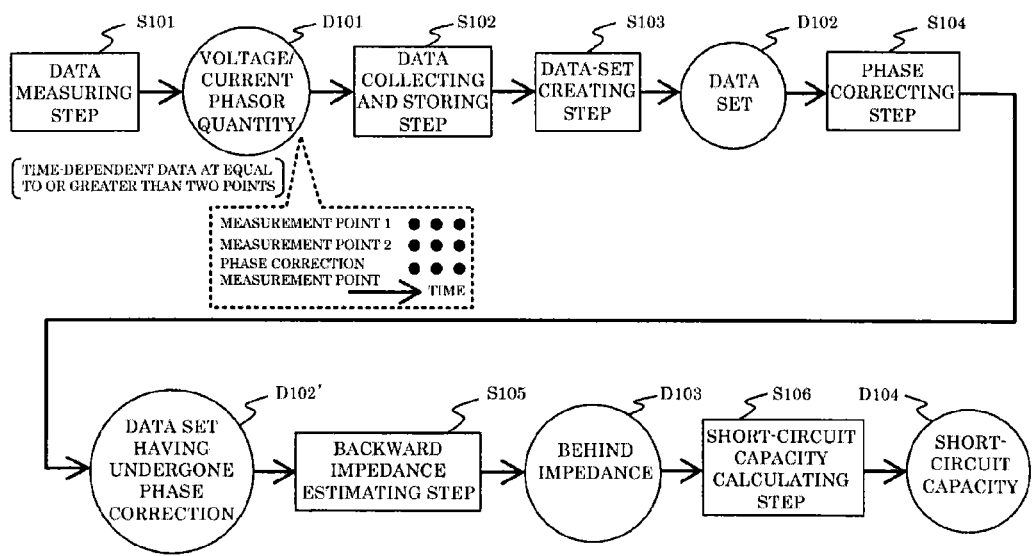
FIG. 2 is a diagram illustrating a process flow in the first embodiment.

Next, a detailed explanation will be given of a power-system short-circuit monitoring method of the first embodiment with reference to the process flow in FIG. 2. First, the synchronous measuring terminals 5 synchronously measure (data measuring step S101) phasor quantities D101 of the voltage and the current at measurement points 1, 2 that are respective measurement points, and a voltage phasor quantity D101 at the phase correction measurement point with time using the synchronizing signal transmitted from the synchronizing signal satellite 6, and the data collecting memory 8 of the short-circuit monitoring device 7 collects and stores (data collecting and storing step S102) the phasor quantities D101 of the voltage and the current.

In addition, in the arithmetic processor 9 of the short-circuit monitoring device 7, a data-set creating step S103 by the data-set creating block 91, a phasor quantity phase correcting step S104 by the phase correcting block 92, a backward impedance estimating step S014 by the backward impedance estimating block 93, and a short-circuit capacity calculating step S105 by the short-circuit capacity calculating block 94 are sequentially performed.

That is, in the data-set creating block 91, based on the collected and stores phasor quantities D101 of the voltage and the current, a data set D102 having n pieces of data is created (data-set creating step S103) for each measurement cycle Δt. Using this data set D102, the phase correcting block 92 corrects the phase of the phasor quantity, and creates a correct data set D102' (phase correcting step S104). Next, using the data set D102' having the phase corrected, the backward impedance estimating block 93 estimates a backward impedance D103 (backward impedance estimating step S105). Eventually, based on the estimated backward impedance D103, the short-circuit capacity calculating block 94 calculates the short-circuit capacity D104 (short-circuit capacity calculating step S106).

[Data-set Creating Step]

Figure 3:
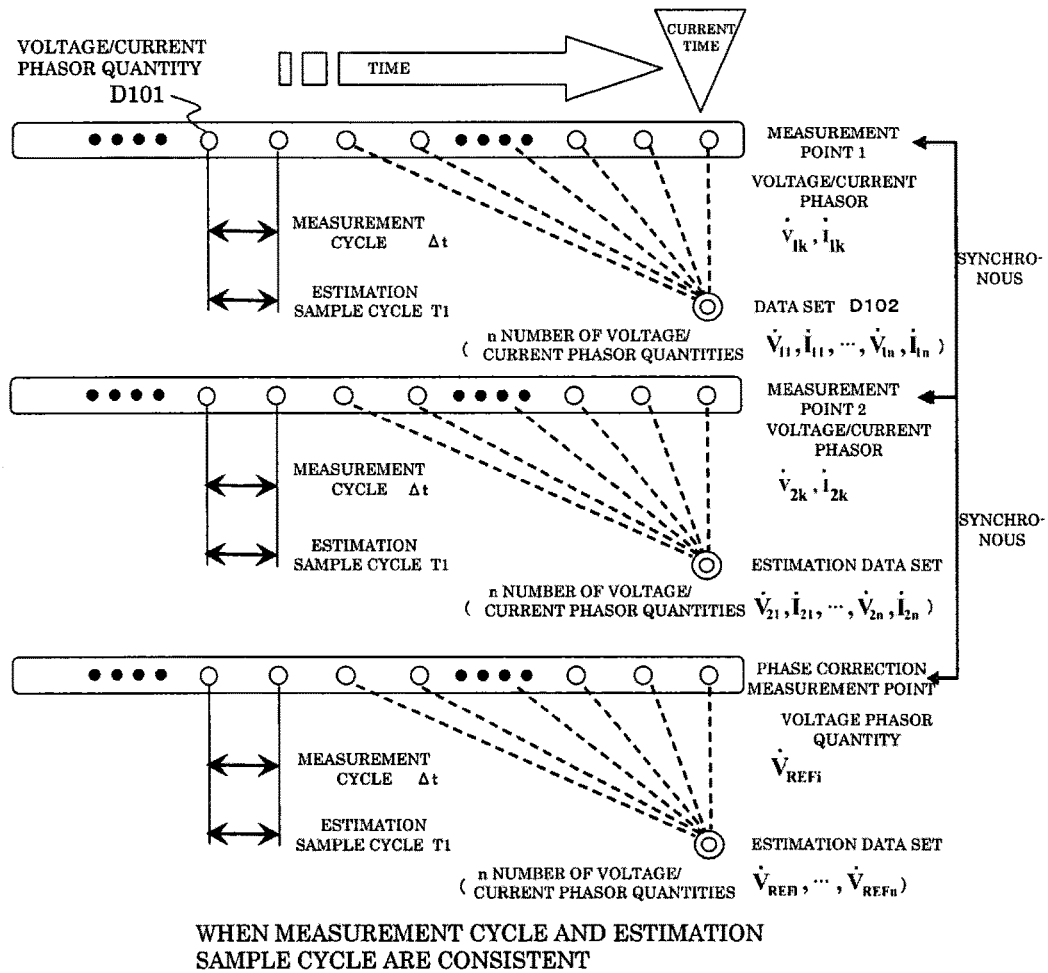
FIG. 3 is an explanatory diagram for a process of creating an estimation data set based on a voltage phasor quantity and current phasor quantity at each measurement point in the first embodiment.

The steps S103 to S106 by the arithmetic processor 9 will be explained in more detail. First, an explanation will be given the data-set creating step S103 by the data-set creating block 91 with reference to FIG. 3. FIG. 3 is an explanatory diagram for a method of creating the voltage/current phasor quantities D101 at the measurement points 1, 2, and a method of creating the data set D102 from the voltage phasor quantity D101 at the phase correction measurement point.

The voltage/current phasor quantities D101 in FIG. 3 are the phasor quantity of the line-to-line voltage and that of the line-to-line current synchronously measured with time by the synchronous measuring terminals 5 at the measurement points 1, 2. In addition, the voltage phasor quantity D101 is the phasor quantity of the line-to-line voltage synchronously measured with time at the phase correction measurement point by the synchronous measuring terminal 5. In the example in FIG. 3, n number of phasor quantities $V_{1k}$, $I_{1k}$ and $V_{2k}$, $I_{2k}$ of the voltage and the current at the respective measurement points 1, 2, and the phasor quantity $V_{REFk}$ of the voltage at the phase correction measurement point are collected for each measurement cycle Δt (where k=1, 2, . . . n).

That is, at the measurement-point-1 side, n number of phasor quantities $V_{11}, I_{11}, \ldots V_{1n}, I_{1n}$ of the voltage and the current are collected, and a data set D102A is created based on those pieces of measured data. In addition, at the measurement-point-2 side, n number of phasor quantities $V_{21}, I_{21}, \ldots, V_{2n}, I_{2n}$ of the voltage and the current are collected, and a data set D102B is created based on those pieces of measured data. Still further, at the phase-correction-measurement-point side, n number of voltage phasor quantities $V_{REF1}, \ldots, V_{REFn}$ are collected, and a data set D102C is created based on those pieces of measured data. An estimation sample cycle T1 of the data set D102 for an estimation is set to be equal to the measurement cycle Lt. In FIG. 3, a dot is added above an alphabet indicating an electricity quantity, and this indicates a phasor quantity. The same is true of the expression of a phasor quantity in other figures and respective formulae to be discussed later.

[Phase Correcting Step]

Figure 4:
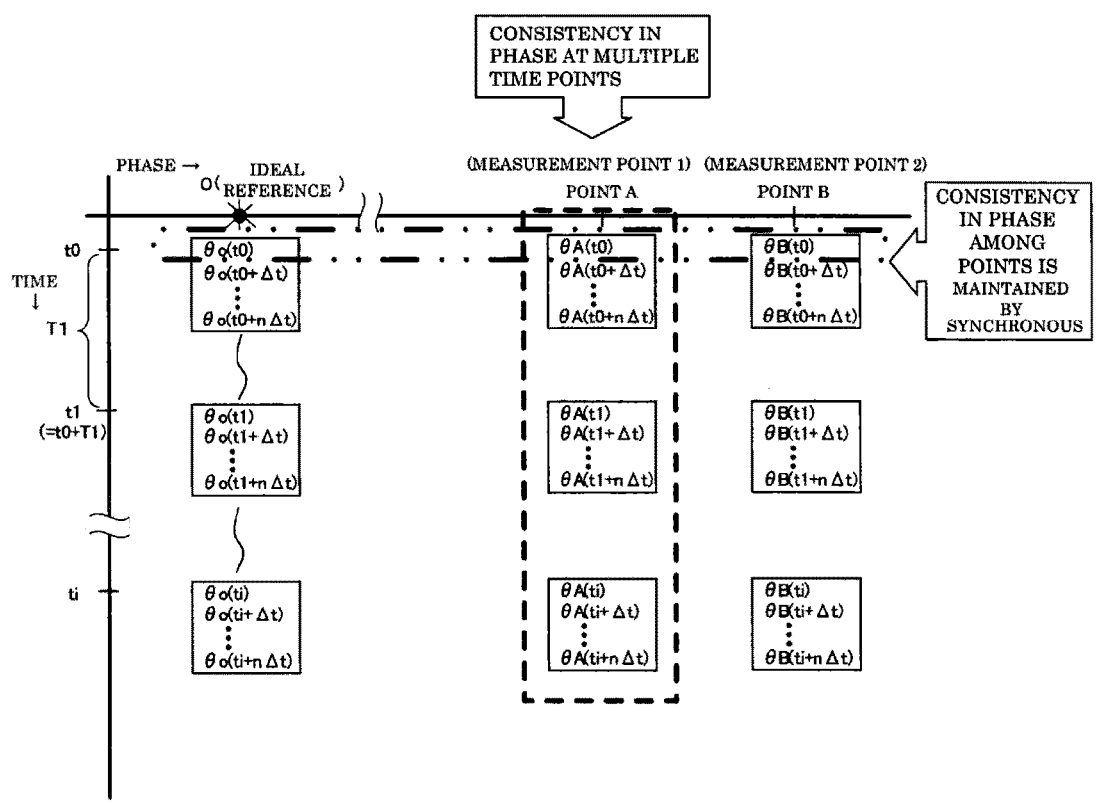
FIG. 4 is a diagram for explaining a relationship between a time and a phase in a voltage phasor quantity in the first embodiment.

Next, an explanation will be given of the phase correcting step S104 by the phase correcting block 92 with reference to FIGS. 4 to 7. FIG. 4 illustrates a relationship between a time and a phase in the voltage phasor quantity in the data set D102. In FIG. 4, the vertical axis indicates a time, while the horizontal axis indicates a phase. The phase of the backward power source is indicated as an ideal reference. It is presumed that a phase at a point A (measurement point 1) is θA, and a phase at a point B (measurement point 2) is θB.

A sinusoidal AC voltage v can be expressed as the formula (1) when the magnitude is V [V], the phase is θ [rad], an angular speed is ω [rad/s]=2πf, and a time is t [s]. Note that f is a system frequency [Hz].

[Formula 1]

$$v = V \cos(\omega t + \theta) \quad (1)$$

When the formula (1) is expressed by a phasor quantity, it becomes data containing the magnitude V and the phase θ as expressed by the following formula (2).

[Formula 2]

$$\dot{V} = V \angle \theta \quad (2)$$

When the formula (1) is expressed by a phasor quantity, based on a presumption that the angular speed is constant, the angular speed ω in the formula (1) can be eliminated. The phasor quantities synchronously measured at the point A and the point B indicate a magnitude and a phase relationship in a given time cross-section. At this time, at the two measurement points, when a phasor quantity is synchronously measured at a given time cross-section, the phase between the points can maintain the consistency (see a portion surrounded by double dotted lines in FIG. 4).

However, in view of the respective measurement points being as multiple time points, in a stationary condition, the system frequency slightly changes. Hence, the angular speed ω in the formula (1) changes with time, and the phase of the phasor quantity in the formula (2) is affected by a change in the system frequency. Therefore, it is difficult to maintain the consistency in phase throughout multiple time points at the same measurement point, i.e., different time cross-sections.

Figure 5:
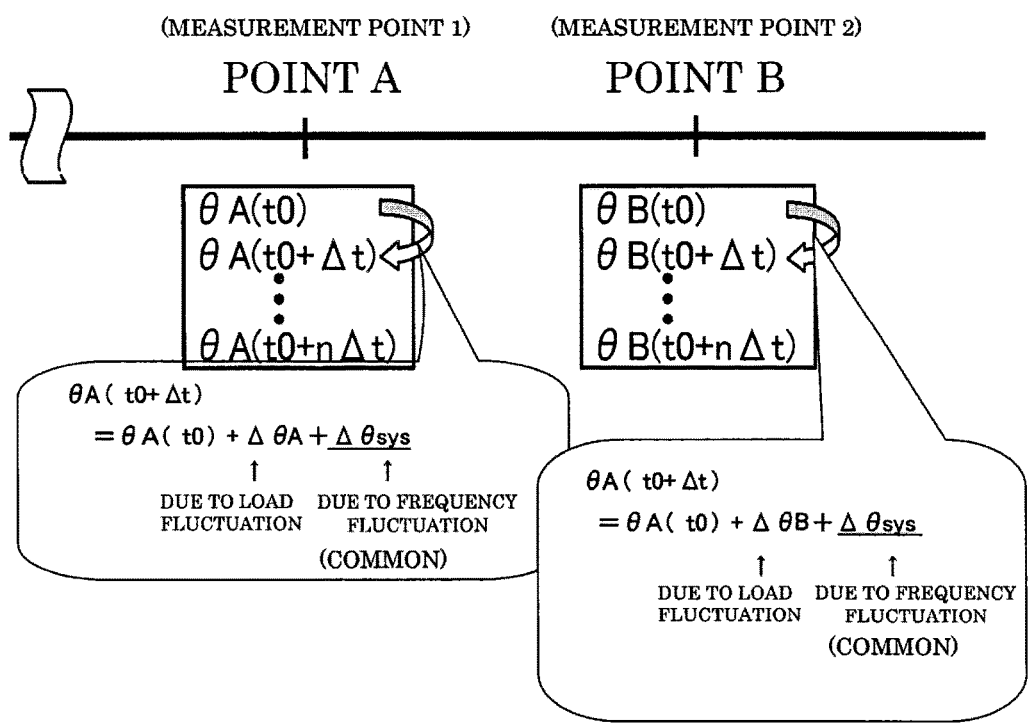
FIG. 5 is a diagram for explaining a change in voltage phase with time using a load fluctuation and a frequency change in the first embodiment.

A change in the voltage phase with time in each measurement point contains, as is indicated in the following formulae (3) and (4) and FIG. 5, phase change components ΔθA, ΔθB by a load fluctuation, and a phase change component Δθsys by a system frequency change. The load fluctuation is local, but the system frequency change is common to all systems.

[Formula 3]

$$\text{POINT } A: \theta A(t0+\Delta t) = \theta A(t0) + \Delta \theta A + \Delta \theta sys \quad (3)$$

[Formula 4]

$$\text{POINT } B: \theta B(t0+\Delta t) = \theta B(t0) + \Delta \theta B + \Delta \theta sys \quad (4)$$

In the backward impedance estimating step S105 to be discussed later, the tiny fluctuation of a load is utilized, and thus the phase change components ΔθA, ΔθB by a load fluctuation are necessary. Hence, in the phase correcting step S104 of the first embodiment, a process of eliminating a change in the system frequency is performed. In addition, in the phase correcting step S104, a process of maintaining the consistency in the phase at multiple time points are also performed (see a portion surrounded by dotted lines in FIG. 4).

Figure 6:
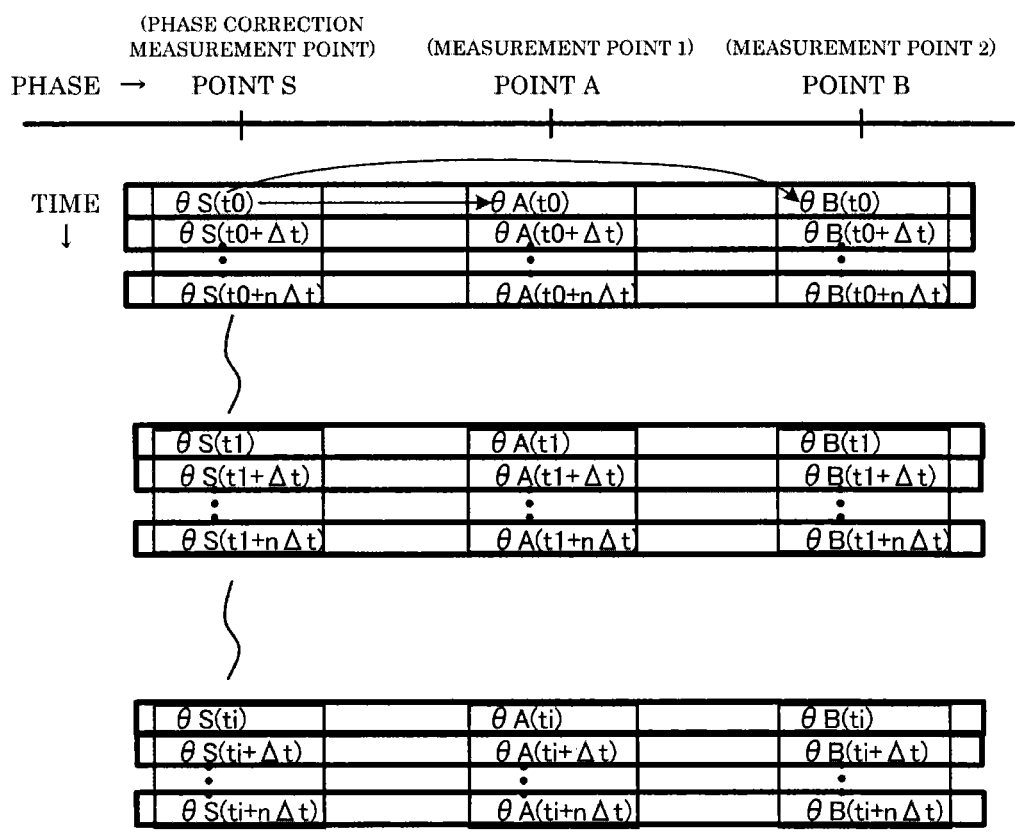
FIG. 6 is a diagram for explaining a method of eliminating a frequency fluctuation in the first embodiment.

First, an explanation will be given of the process of eliminating a change in the system frequency with reference to FIG. 6. As illustrated in FIG. 6, the phase correcting block 92 subtracts the voltage phase at the phase correction measurement point from each of the voltage phases at the measurement points 1, 2 (see an arrow in the figure). Since a change in the system frequency is common to all systems, only the phase change components ΔθA, ΔθB by a load fluctuation are relatively left. The phase correcting block 92 performs the eliminating process of this system frequency change for each phasor quantity in a time series.

Figure 7:
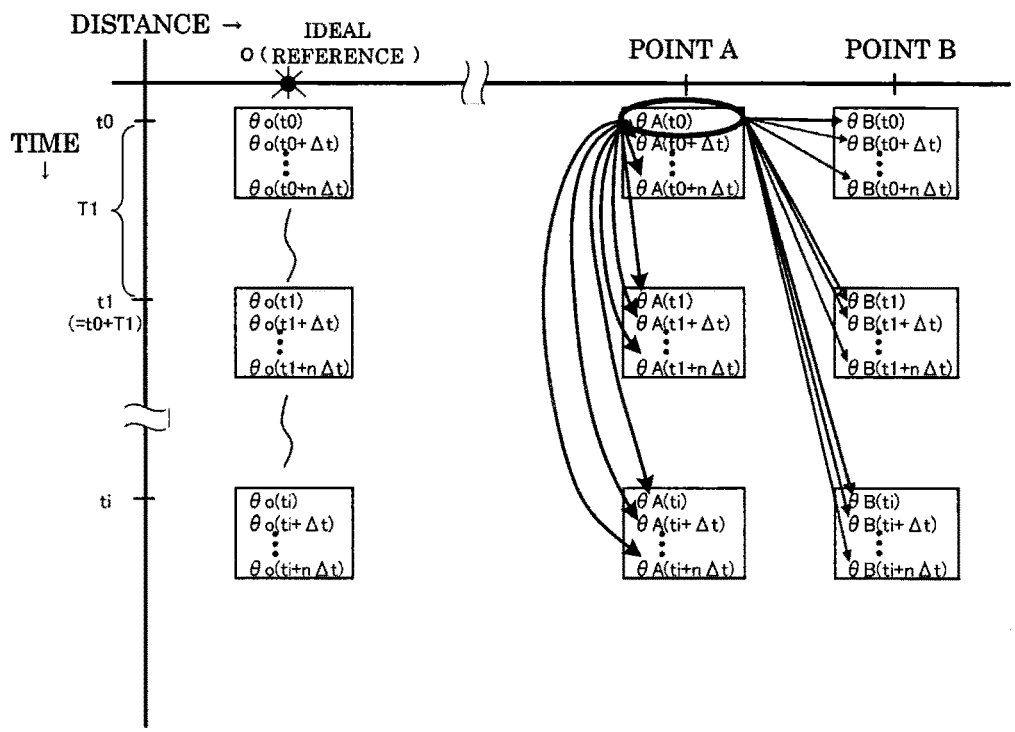
FIG. 7 is a diagram for explaining a method of maintaining the coherency of phases at multiple time points in the first embodiment.

Next, with reference to FIG. 7, an explanation will be given of the process of maintaining the consistency in the phase at multiple time points. The phase correcting block 92 selects, as a reference phase, the voltage phase at a certain arbitrary time and at any one of the measurement points, and subtracts the selected reference phase from the voltage phases of the measurement points 1, 2. It is appropriate if the reference phase is set for each data set. In the example in FIG. 7, the voltage phase at the first time in the data set at the point A is selected as the reference phase, and the selected reference phase is subtracted from the voltage phases of the point A and the point B that are the measurement points (see an arrow in the figure).

Formulae (5) to (8) indicate example calculations of maintaining the phase consistency at multiple time points and of eliminating the system frequency change at times t1 and t2. Those examples are cases in which the point A is taken as the reference point. That is, by subtracting the voltage phase of the phase correction measurement point from the phases of the point A and the point B, the system frequency change is eliminated, and the load fluctuation component is left. In addition, by subtracting the selected reference phase from the phases of the point A and the point B, the system frequency change is eliminated, and the load fluctuation component having a time t0 as an origin is left. The calculation is likewise performed for the subsequent time points, and the phase correcting block 92 creates the data set D102' having the phase corrected.

<Time t1>
Phase of Point a:

[Formula 5]

$$\theta_A(t1) - \{\theta_s(t1) + \theta_A(t0)\} = \theta_A(t0) + \Delta\theta_A(t0 + \Delta t) + \Delta\theta_{sys}(t0 + \Delta t) - \quad (5)$$
$$\{\theta_s(t0) + \Delta\theta_{sys}(t0 + \Delta t) + \theta_A(t0)\}$$
$$= \underline{\Delta\theta_A(t0 + \Delta t) - \theta_s(t0)}$$

Phase of Point B:

[Formula 6]

$$\theta_B(t1) - \{\theta_s(t1) + \theta_A(t0)\} = \theta_B(t0) + \Delta\theta_B(t0+\Delta t) + \Delta\theta_{sys}(t0+\Delta t) - \quad (6)$$
$$\{\theta_s(t0) + \Delta\theta_{sys}(t0+\Delta t) + \theta_A(t0)\}$$
$$= \underline{\Delta\theta_B(t0+\Delta t)} - \theta_s(t0) - \theta_A(t0) + \theta_B(t0)$$

<Time t2>
Phase of Point A:

[Formula 7]

$$\theta_A(t2) - \{\theta_s(t2) + \theta_A(t0)\} = \theta_A(t1) + \Delta\theta_A(t1+\Delta t) + \Delta\theta_{sys}(t1+\Delta t) - \quad (7)$$
$$\{\theta_s(t1) + \Delta\theta_{sys}(t1+\Delta t) + \theta_A(t0)\}$$
$$= \theta_A(t0) + \Delta\theta_A(t0+\Delta t) + \Delta\theta_{sys}(t0+\Delta t) +$$
$$\Delta\theta_A(t1+\Delta t) -$$
$$\{\theta_s(t0) + \Delta\theta_{sys}(t0+\Delta t) + \theta_A(t0)\}$$
$$= \underline{\Delta\theta_A(t0+\Delta t) + \Delta\theta_A(t1+\Delta t)} - \theta_s(t0)$$

Phase of Point B:

[Formula 8]

$$\theta_B(t2) - \{\theta_s(t2) + \theta_A(t0)\} = \theta_B(t1) + \Delta\theta_B(t1+\Delta t) + \Delta\theta_{sys}(t1+\Delta t) - \quad (8)$$
$$\{\theta_s(t1) + \Delta\theta_{sys}(t1+\Delta t) + \theta_A(t0)\}$$
$$= \theta_B(t0) + \Delta\theta_B(t0+\Delta t) + \Delta\theta_{sys}(t0+\Delta t) +$$
$$\Delta\theta_B(t1+\Delta t) -$$
$$\{\theta_s(t0) + \Delta\theta_{sys}(t0+\Delta t) + \theta_A(t0)\}$$
$$= \underline{\Delta\theta_B(t0+\Delta t) + \Delta\theta_B(t1+\Delta t)} - \theta_s(t0) -$$
$$\theta_A(t0) + \theta_B(t0)$$

[Backward Impedance Estimating Step]

In the backward impedance estimating step S105, using multiple pieces of data set D102' created by the phase correcting block 92 as explained above, the backward impedance estimating block 93 estimates a backward impedance.

Figure 8:
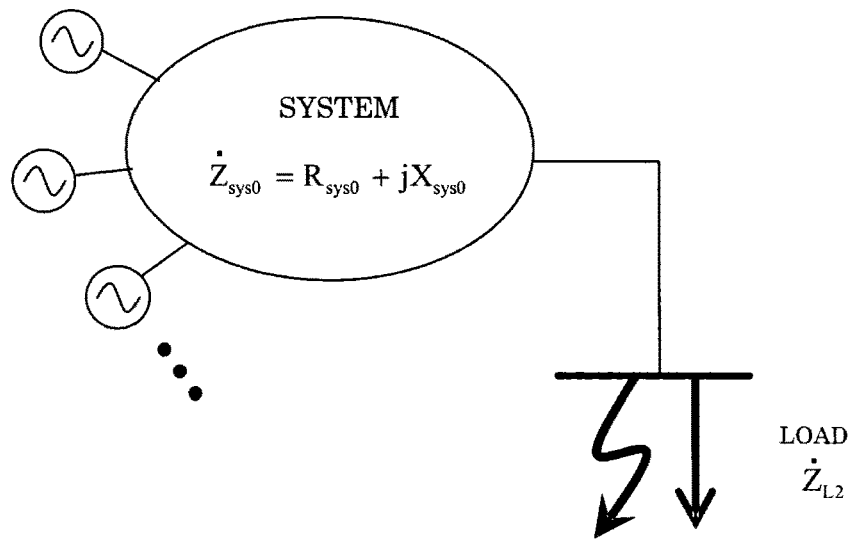
FIG. 8 is an explanatory diagram for a power system when a short-circuit failure occurs in the first embodiment.
Figure 9:
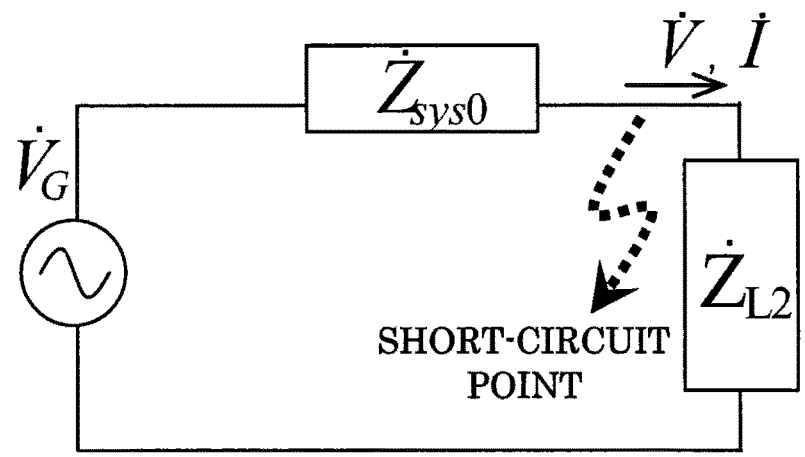
FIG. 9 is an explanatory diagram for an equivalent circuit before a short-circuit failure occurs in the first embodiment.

FIG. 8 is a diagram illustrating, as to the power system when a short-circuit failure occurs, a backward impedance $Z_{sys0}$ (=$R_{sys0}$+j$X_{sys0}$) when a power-source side is viewed from a short-circuit point, and a load impedance $Z_{L2}$ when the load side is viewed from the short-circuit point. In addition, FIG. 9 is an equivalent circuit before a short-circuit failure occurs, and $V_G$ (=$V_{Gr}$+j $V_{Gi}$) is a backward voltage.

As to the backward voltage $V_G$, the backward impedance $Z_{sys0}$, and the voltage/current phasor quantities $V_k$, $I_k$ (where k=1, 2, ... n) that are measured data at a point, a relationship expressed by the following formula (9) is satisfied.

[Formula 9]

$$\dot{V}_G = \dot{V}_k + \dot{Z}_{sys0}\dot{I}_k (k=1,2, \ldots n) \quad (9)$$

When the following formula (10) is substituted in the formula (9), the relationship in the formula (9) can be indicated by the following formula (11).

[Formula 10]

$$\dot{V}_k = V_{rk} + jV_{ik}, \dot{I}_k = I_{rk} + jI_{ik} \quad (10)$$

[Formula 11]

$$\begin{bmatrix} V_{rk} \\ V_{ik} \end{bmatrix} = \begin{bmatrix} 1 & 0 & -I_{rk} & I_{ik} \\ 0 & 1 & -I_{ik} & -I_{rk} \end{bmatrix} \begin{bmatrix} V_{Gr} \\ V_{Gi} \\ R_{sys0} \\ X_{sys0} \end{bmatrix} \quad (11)$$

When it is presumed that in each measurement point, the time period for measuring n number of voltage/current phasor quantities $V_k$, $I_k$ is only the tiny fluctuation of the system and the backward impedance $Z_{sys0}$ is constant, as to the multiple pieces of measured data that are $V_{rk}$, $V_{ik}$, $I_{rk}$, and $I_{ik}$, the aforementioned formula (11) is satisfied.

Hence, when, for example, the least squares method is applied, the backward voltage $V_G$ (=$V_{Gr}$+j$V_{Gi}$) and the backward impedance $Z_{sys0}$ (=$R_{sys0}$+j$X_{sys0}$) can be obtained. How to obtain the backward voltage $V_G$ and the backward impedance $Z_{sys0}$ is not limited to the least squares method, and any methods for obtaining a solution that minimizes the error of the formula (11) can be freely selected.

[Short-Circuit Capacity Calculating Step]

In the short-circuit capacity calculating step S106, the short-circuit capacity calculating block 94 calculates a short-circuit impedance $Z_{sc}$ using the estimated backward impedance $Z_{sys0}$ and a load impedance $Z_{L2}$, and then a short-circuit current $I_{sc}$ and a short-circuit capacity $P_{sc}$ are obtained.

The load impedance $Z_{L2}$ is obtained through the following formula (12) using the measured values of the voltage V and the current I.

[Formula 12]

$$\dot{Z}_{L2} = \frac{\dot{V}}{\dot{I}} \quad (12)$$

Figure 10:
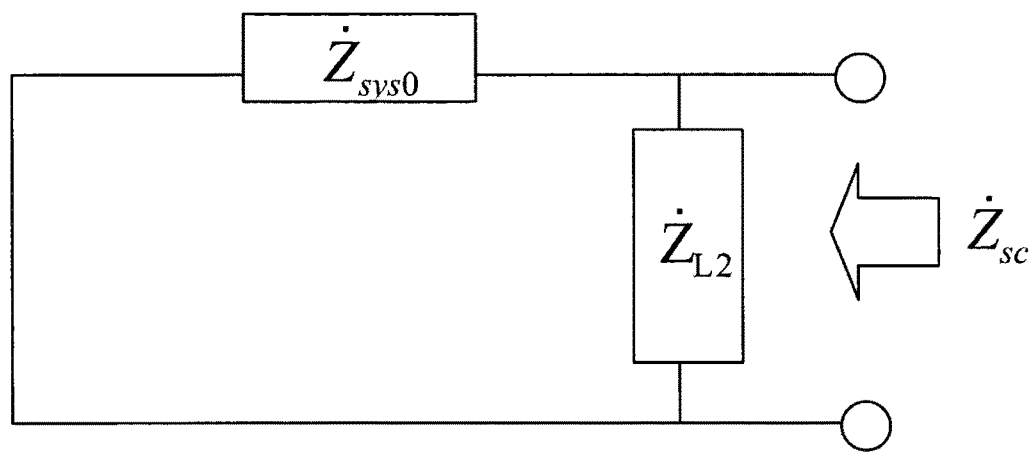
FIG. 10 is an explanatory diagram for a short-circuit impedance in the first embodiment.

Based on the Thevenin's theorem, the internal impedance as viewed from the short-circuit point becomes the short-circuit impedance $Z_{sc}$ (see FIG. 10), and the short-circuit impedance $Z_{sc}$ is given from the following formula (13). That is, a value obtained by dividing the product of the load impedance $Z_{L2}$ and the backward impedance $Z_{sys0}$ by the sum of the load impedance $Z_{L2}$ and the backward impedance $Z_{sys0}$ is the short-circuit impedance $Z_{sc}$.

[Formula 13]

$$\dot{Z}_{sc} = \frac{\dot{Z}_{L2} * \dot{Z}_{sys0}}{\dot{Z}_{L2} + \dot{Z}_{sys0}} \quad (13)$$

Figure 11:
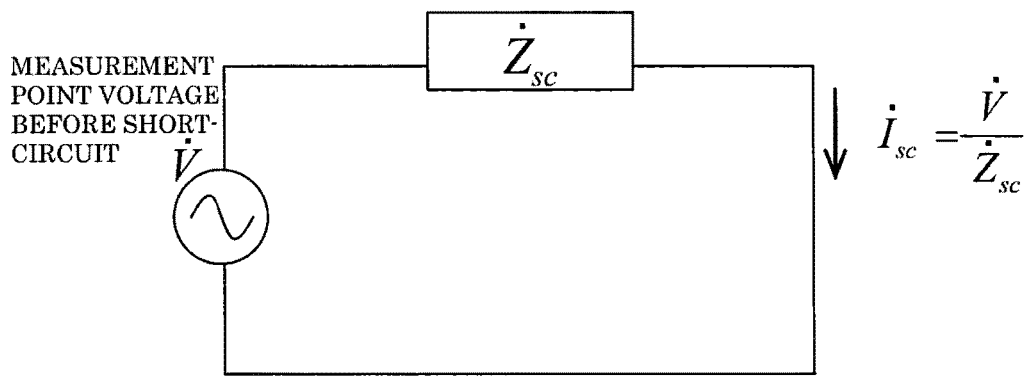
FIG. 11 is an explanatory diagram for an equivalent circuit when a short-circuit failure occurs in the first embodiment.

Based on the short-circuit impedance $Z_{sc}$ obtained as explained above, a value obtained by subtracting the voltage V at the measurement point before a short-circuit failure occurs is the short-circuit current $I_{sc}$ (see FIG. 11 and the formula (14)).

[Formula 14]

$$\dot{I}_{sc} = \frac{\dot{V}}{\dot{Z}_{sc}} \quad (14)$$

In addition, as is indicated by the following formula (15), by multiplying the short-circuit current $I_{sc}$ by the voltage V at the measurement point before a short-circuit failure occurs, the short-circuit capacity $P_{sc}$ can be obtained.

[Formula 15]

$$\dot{P}_{sc} = \dot{I}_{sc} * \dot{V} \quad (15)$$

As explained above, the short-circuit capacity calculating block 94 calculates the short-circuit capacity $P_{sc}$ and the short-circuit current $I_{sc}$ based on the backward impedance $Z_{sys0}$ estimated by the backward impedance estimating block 93 and the formulae (12) to (15). The obtained short-circuit capacity $P_{sc}$ or short-circuit current $I_{sc}$ is obtained as the distribution of the n pieces of data in the data set D102'. Hence, for the actual short-circuit capacity $P_{sc}$ or short-circuit current $I_{sc}$, the center value, the most frequent value, or the average value is taken as the representative value.

[Backward Impedance Estimating Process When Measurement is Performed at Two Points with Power Line Therebetween]

The system includes a power line and a load. Hence, it is necessary to have redundancy and to enhance the estimation precision of the backward impedance by measuring the phasor quantity at points with a power line therebetween in addition to the measurement at the multiple short-circuit points. In this case, an explanation will be given of a backward impedance estimating step when measurement is performed at two points with a power line therebetween.

Figure 12:
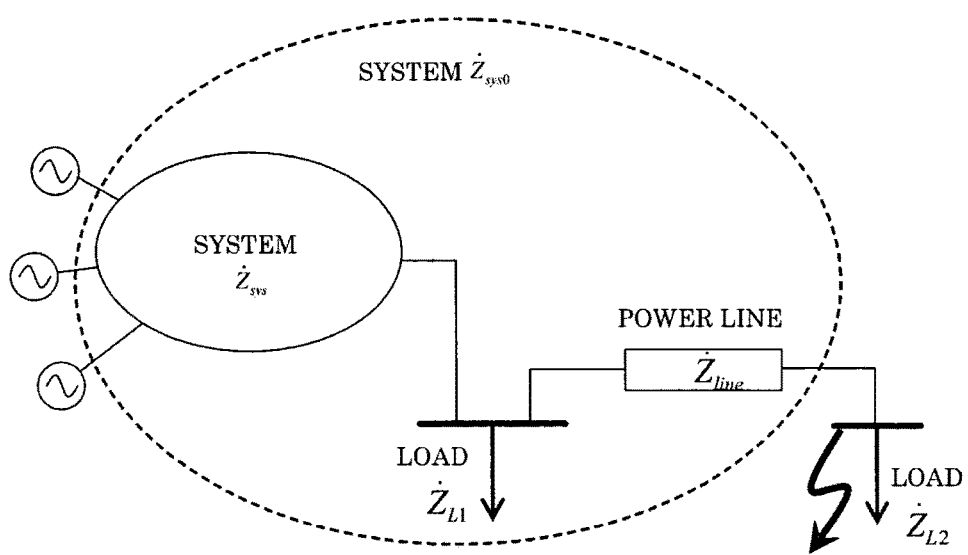
FIG. 12 is an explanatory diagram for a power system when a short-circuit failure occurs and when measured at two points through a power line in the first embodiment.
Figure 13:
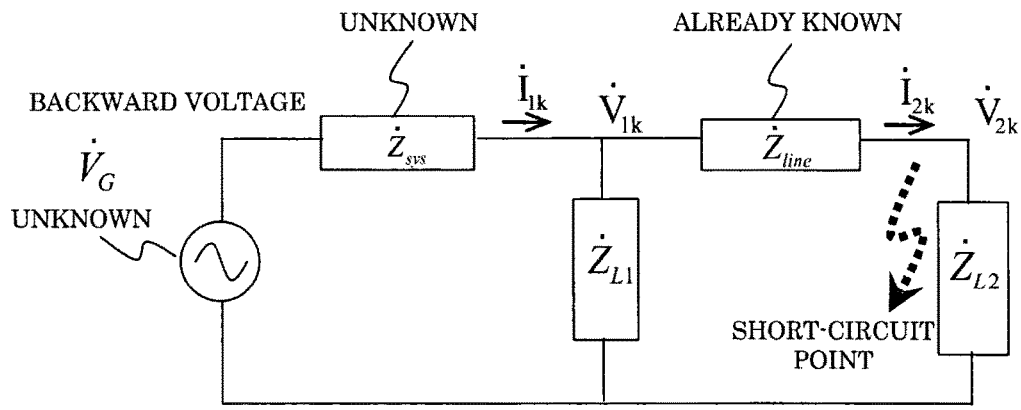
FIG. 13 is an explanatory diagram for an equivalent circuit before a short-circuit failure occurs and when measured at two points through a power line in the first embodiment.
Figure 14:
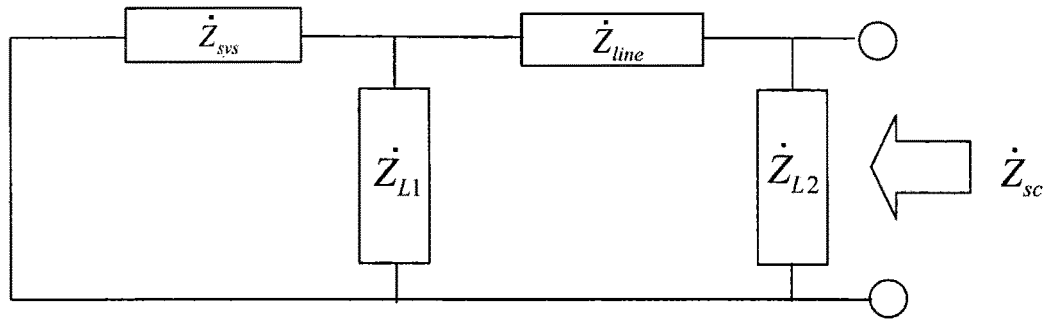
FIG. 14 is an explanatory diagram for a short-circuit impedance when measured at two points through a power line in the first embodiment.
Figure 15:
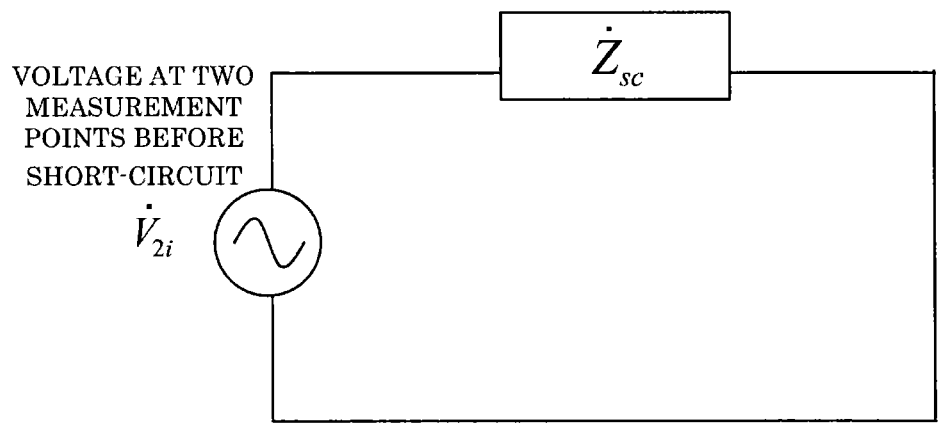
FIG. 15 is an explanatory diagram for an equivalent circuit when a short-circuit failure occurs and when measured at two points through a power line in the first embodiment.

FIG. 12 illustrates a power system when the power system before a short-circuit failure occurs is expressed with the backward impedance $Z_{sys}$ (=$R_{sys}$+$jX_{sys}$) on a power-source side as viewed from a load end via a power line, a power-line impedance $Z_{line}$, and load impedances $Z_{L1}$, $Z_{L2}$. In addition, FIG. 13 illustrates an equivalent circuit before a short-circuit failure occurs. Based on the Thevenin's theorem, the internal impedance as viewed from the short-circuit point becomes the short-circuit impedance $Z_{sc}$, and it is expressed as the following formula (16) (see FIG. 14). FIG. 15 illustrates an equivalent circuit when a short-circuit failure occurs.

[Formula 16]

$$\dot{Z}_{sc} = \frac{1}{\frac{1}{\frac{1}{\frac{1}{\dot{Z}_{sys}} + \frac{1}{\dot{Z}_{L1}}} + \dot{Z}_{line}} + \frac{1}{\dot{Z}_{L2}}}$$

$$= \frac{\dot{Z}_{L2}(\dot{Z}_{sys}\dot{Z}_{L1} + \dot{Z}_{line}(\dot{Z}_{sys} + \dot{Z}_{L1}))}{\dot{Z}_{sys}\dot{Z}_{L2} + \dot{Z}_{L1}\dot{Z}_{L2} + \dot{Z}_{sys}\dot{Z}_{L1} + \dot{Z}_{line}(\dot{Z}_{sys} + \dot{Z}_{L1})} \quad (16)$$

In this case, the load impedances $Z_{L1}$, $Z_{L2}$ can be calculated from the following formulae (17), (18) based on the respective measured values.

[Formula 17]

$$\dot{Z}_{L1} = \frac{\dot{V}_1}{\dot{I}_1 - \dot{I}_2} \quad (17)$$

[Formula 18]

$$\dot{Z}_{L2} = \frac{\dot{V}_2}{\dot{I}_2} \quad (18)$$

As to the power line impedance $Z_{line}$, a constant is applied or a calculation through the following formula (19) is performed using the measured value.

[Formula 19]

$$\dot{Z}_{line} = \frac{\dot{V}_1 - \dot{V}_2}{\dot{I}_2} \quad (19)$$

In the case of the measurements at two points, as to the backward voltage $V_G$, the backward impedance $Z_{sys}$, the power line impedance $Z_{line}$, and the measured data (multiple voltage and current phasor quantities measured with time) $V_{1k}$, $I_{1k}$, $V_{2k}$, $V_{2k}$ at the two points, a relationship expressed by the following formula (20) is satisfied.

[Formula 20]

$$\dot{V}_G - \dot{Z}_{sys}\dot{I}_k - \dot{Z}_{line}\dot{I}_{2k} = \dot{V}_{2k}(k=1,2,\ldots n) \quad (20)$$

When the following formula (21) is substituted in the formula (20), the relationship in the formula (20) can be expressed by the formula (22).

[Formula 21]

$$\dot{V}_G - \dot{Z}_{sys}\dot{I}_k - \dot{Z}_{line}\dot{I}_{2k} = \dot{V}_{2k} \quad (21)$$
$$(k = 1, 2, \ldots n)$$

[Formula 22]

$$\begin{bmatrix} u_{2k} - R_{line}g_{2k} + X_{line}h_{2k} \\ w_{2k} - R_{line}h_{2k} - X_{line}g_{2k} \end{bmatrix} = \begin{bmatrix} 1 & 0 & -g_{1k} & h_{1k} \\ 0 & 1 & -h_{1k} & -g_{1k} \end{bmatrix} \begin{bmatrix} V_{Gr} \\ V_{Gi} \\ R_{sys} \\ X_{sys} \end{bmatrix} \quad (22)$$

$$(k = 1, 2, \ldots n)$$

In this case, $\dot{V}_G = V_{Gr} + jV_{Gi}$, $\dot{Z}_{sys} = R_{sys} + jX_{sys}$ $$\dot{Z}_{line} = R_{line} + jX_{line} \quad (22)$$

The backward voltage $V_G$ (=$V_{Gr}$+$jV_{Gi}$) and the backward impedance $Z_{sys}$ (=$R_{sys}$+$X_{sys}$) can be resolved by applying, for example, the least squares method to the formula (22) like the case of the measurement at one point. How to obtain the backward voltage $V_G$ and the backward impedance $Z_{sys}$ is not limited to the least squares method, and any schemes of obtaining a solution that minimizes the error of the formula (22) can be freely selected like the case of the measurement at one point.

[Short-Circuit Capacity Calculating Process when Measurement is Performed at Two Points with Power Line Therebetween]

Based on the backward impedance $Z_{sys}$ estimated as explained above, and the aforementioned formulae (16) to (19), the short-circuit impedance $Z_{sc}$ can be calculated, and based on the calculation result and the aforementioned formulae (14), (15), the short-circuit current $I_{sc}$ and the short-circuit capacity $P_{sc}$ can be obtained. When such measurement at two points is performed, the load fluctuation at each measurement point can be grasped through measured data, and thus the estimation error of the backward impedance $Z_{sys}$ can be reduced.

[Advantageous Effects]

As explained above, according to the first embodiment, the backward impedance is estimated based on multiple pieces of synchronous measured data, and the short-circuit capacity is calculated based on the estimated backward impedance. Hence, even if the short-circuit capacity changes, a short-circuit capacity in accordance with an actual condition for a necessary cross-section can be precisely obtained.

In addition, a phase correction of eliminating the system frequency change while maintaining the consistency of the phase at multiple time points is performed. Hence, even if the measurement time is different and the system frequency changes, the measured phasor quantity is not affected by a change in the system frequency. Therefore, it becomes possible to highly precisely estimate the backward impedance, and the short-circuit capacity in accordance with an actual condition can be precisely obtained.

Thus, the precise short-circuit capacity can be monitored periodically. When the system divisional operation is performed for suppressing a short-circuit capacity, such an operation can be retained as minimum as necessary. Hence, the flexibility of the system operation can be ensured, and the advantages of the system interconnection can be effectively utilized. Moreover, the set value of a protection relay can be selected in accordance with the actual condition, and thus it contributes an improvement of electrical power quality.

(2) Second Embodiment

[Configuration]

Figure 16:
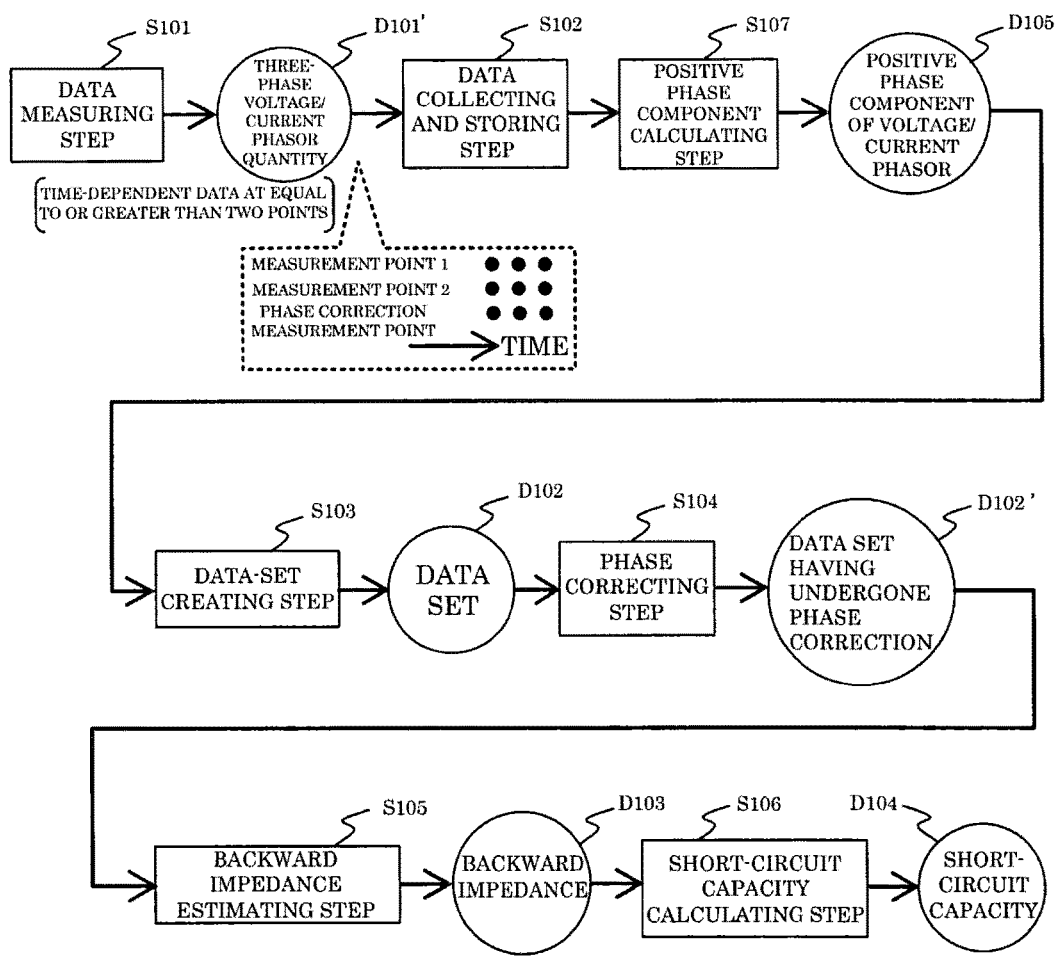
FIG. 16 is a diagram illustrating a process flow according to a second embodiment of the present disclosure.

Next, a second embodiment of the present disclosure will be explained with reference to FIG. 16. FIG. 16 illustrates an example process procedure in the second embodiment. In embodiments including and subsequent to the second embodiment, the same structure as that of the first embodiment will be denoted by the same reference numeral, and the duplicated explanation thereof will be omitted.

According to a power-system short-circuit capacity monitoring system of the second embodiment, as the measured data synchronously measured with time by the synchronous measuring terminal 5, three-phase voltage and current phasor quantities D101' at each measurement point are utilized, and the arithmetic processor 9 of the short-circuit capacity monitoring device 7 performs a positive phase component calculating step S107 for calculating a positive phase component between the data collecting and storing step S102 and the data-set creating step S103.

In the positive phase component calculating step S107, the three-phase voltage and current phasor quantities data D101' measured by the synchronous measuring terminal 5 is input, and is subjected to a symmetrical coordinate conversion to calculate a positive phase component D105 of the voltage and the current phasor quantities, and the obtained positive phase component D105 is transmitted to the data-set creating block 91.

The positive phase component calculating step S107 may be performed at the synchronous-measuring-terminal-5 side instead of the arithmetic processor 9 of the short-circuit capacity monitoring device 7. In this case, the synchronous measuring terminal 5 synchronously measures with time the positive phase component D105 of the voltage/current phasor quantity, and transmits the measured positive phase component D105 to the short-circuit capacity monitoring device 7.

[Advantageous Effects]

According to the second embodiment, in addition to the above-explained advantageous effects of the first embodiment, the adverse effect of unbalancing in the system can be expelled by utilizing the three-phase voltage and current phasor quantities D101' as the measured data. Hence, the short-circuit capacity can be further precisely obtained.

(3) Third Embodiment

[Configuration]

Next, a third embodiment of the present disclosure will be explained with reference to FIGS. 17 and 18. The feature of the third embodiment is the data-set creating step S103 by the data-set creating block 91 of the short-circuit capacity monitoring device 7.

The estimation data set contains the voltage phasor quantities and the current phasor quantities measured multiple times, thus having a certain distribution. In the third embodiment, in the data-set creating step S103 by the data-set creating block 91, a sample cycle T1 and the number n of the data in the data set $V_{1k}$, $I_{1k}$, $V_{2k}$, $I_{2k}$ (where k=1, 2, . . . , n) are set as changeable, and with reference to a distribution of the magnitude of the current $I_2$ at any one of the measurement points, a measuring cycle of the data set $V_{1k}$, $I_{1k}$, $V_{2k}$, $I_{2k}$ (where k=1, 2, . . . , n) is selected. For example, 10 measured values of the distribution having a standard deviation σ becoming equal to or greater than a certain level within 30 minutes are selected as the estimation data set $V_{1k}$, $I_{1k}$, $V_{2k}$, $I_{2k}$ (where k=1, 2, . . . , n). Since the magnitude of the standard deviation δ depends on the magnitude of the load at the measurement point, for example, a distribution that is equal to or greater than 5% of the load average value is selected.

In this case, an explanation will be given of how to set the estimation data set for a case in which the tiny fluctuation of the power system 1 is large and a case in which the tiny fluctuation of the power system 1 is small with reference to the graphs of FIGS. 17 and 18. FIGS. 17A and 17B illustrate a phasor quantity distribution when the tiny fluctuation of the power system 1 is large, and FIGS. 18A and 18B illustrate a phasor quantity distribution when the tiny fluctuation of the power system 1 is small.

Figure 17A:
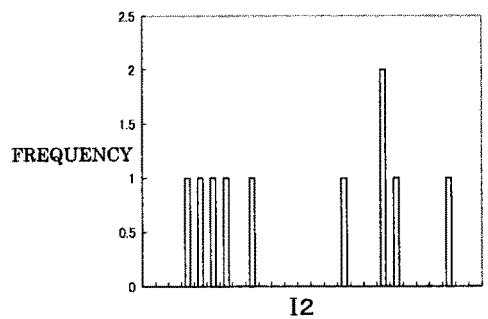
Figure 17B:
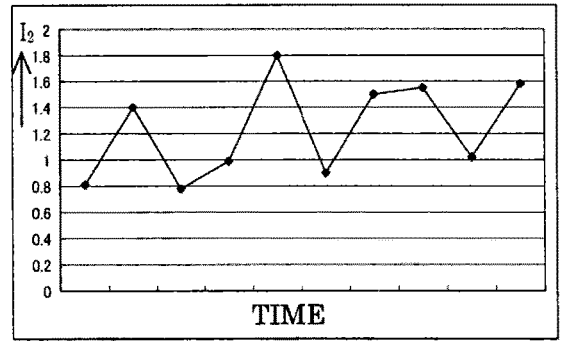
Figure 18A:
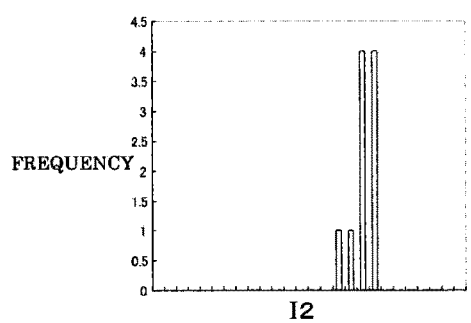
Figure 18B:
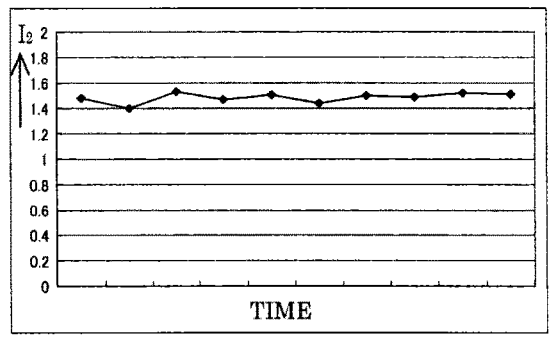

In FIGS. 17 and 18, the left FIGS. 17A, 18A are distribution diagrams of the phasor quantities of the data set $V_{1k}$, $I_{1k}$, $V_{2k}$, $I_{2k}$ with the vertical axis representing a frequency, while the right FIGS. 17B and 18B are conceptual diagrams of a time change with the vertical axis representing the current $I_2$, and illustrate a distribution of magnitudes of the current $I_2$ at a measurement point and at a given time.

When the tiny fluctuation of the power system 1 is large, it means that the distribution of the data set $V_{1k}$, $I_{1k}$, $V_{2k}$, $I_{2k}$ (where k=1, 2, . . . , n) has a large variation (FIG. 17A illustrates a data interval widespread in the horizontal direction). In addition, when the tiny fluctuation of the power system 1 is small, the distribution of the data set $V_{1k}$, $I_{1k}$, $V_{2k}$, $I_{2k}$ (where k=1, 2, . . . , n) has a small variation (FIG. 17B illustrates a data interval compact in the horizontal direction). In this case, when the measuring time period of the data set $V_{1k}$, $I_{1k}$, $V_{2k}$, $I_{2k}$ (where k=1, 2, . . . , n) is too short, a calculation error is caused. Conversely, when the measuring time period of the data set $V_{1k}$, $I_{1k}$, $V_{2k}$, $I_{2k}$ (where k=1, 2, . . . , n) is too long, the system backward impedance $Z_{sys}$ may change during the measuring time period.

Hence, according to the third embodiment, in consideration of the measuring time period of the data set $V_{1k}$, $I_{1k}$, $V_{2k}$, $I_{2k}$ (where k=1, 2, . . . , n) in accordance with the fluctuation condition of the system, the estimation data-set creating block 91 selects the sample cycle T1 of the estimation data set and the number n of data so as to have a widespread distribution width of the voltage/current phasor quantity in the data set $V_{1k}$, $I_{1k}$, $V_{2k}$, $I_{2k}$ (where k=1, 2, . . . , n). In the above explanation, the measuring time period of the estimation data set $V_{1k}$, $I_{1k}$, $V_{2k}$, $I_{2k}$ (where k=1, 2, . . . , n) is selected with reference to the distribution of the current, but the measuring time period of the data set $V_{1k}$, $I_{1k}$, $V_{2k}$, $I_{2k}$ (where k=1, 2, . . . , n) may be selected with reference to the distribution of the voltage and the distribution of the phase other than the distribution of the current.

[Advantageous Effects]

According to the above-explained third embodiment, the following unique advantages can be accomplished. That is, since the sample cycle T1 and the number n of data are set as changeable in the creation of the data set $V_{1k}$, $I_{1k}$, $V_{2k}$, $I_{2k}$ in the data-set creating step S103 by the data-set creating block 91, it becomes possible to estimate the backward impedance $Z_{sys}$ highly precisely. Hence, the calculation error can be reduced, and thus the short-circuit capacity can be obtained highly precisely.

(4) Fourth Embodiment

[Configuration]

Next, an explanation will be given of a fourth embodiment of the present disclosure with reference to FIGS. 19 and 20.

The fourth embodiment has an improvement in the data-set creating step S103 by the data-set creating block 91 like the third embodiment. That is, in the data-set creating step S103 of the fourth embodiment, an outlier is detected from the collected data set $V_{1k}$, $I_{1k}$, $V_{2k}$, $I_{2k}$ (where k=1, 2, . . . , n), and a data set $V_{1k}$, $I_{1k}$, $V_{2k}$, $I_{2k}$ (where k=1, 2, . . . , n) is created by eliminating the outlier from the collected data set.

The data set $V_{1k}$, $I_{1k}$, $V_{2k}$, $I_{2k}$ (where k=1, 2, . . . , n) contains the voltage phasor quantities and the current phasor quantities measured multiple times, thus having a certain distribution. The same is true of the distribution of the current or that of the phase. FIGS. 19 and 20 illustrate a distribution of the magnitudes of a voltage phasor quantities measured at a measurement point and at a given time.

Figure 19:
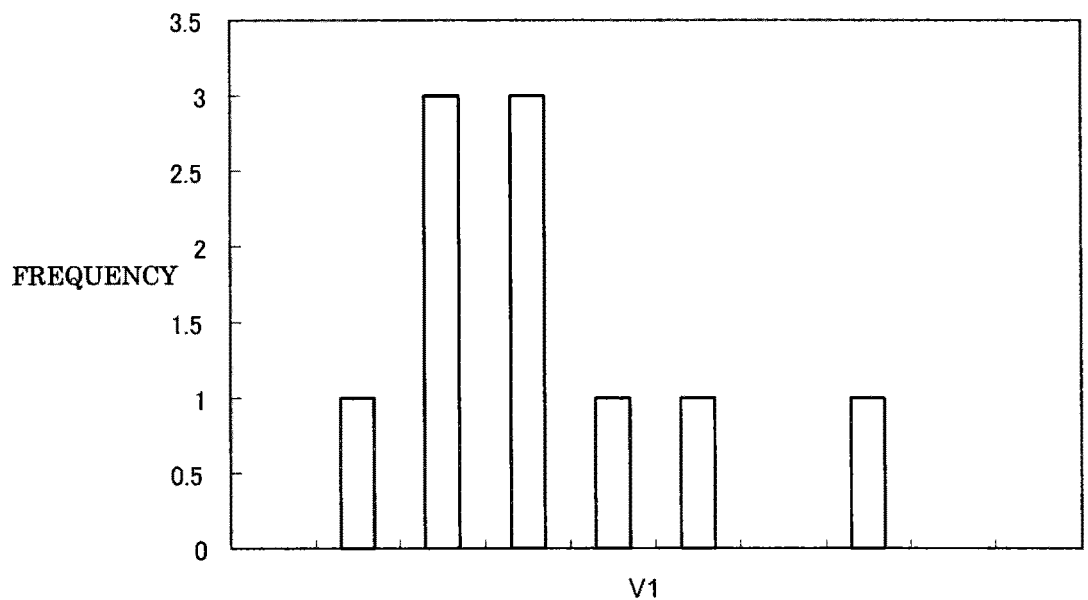
FIG. 19 is a graph for explaining a fourth embodiment of the present disclosure and indicating a distribution when measured voltage phasor quantities have no outlier.
Figure 20:
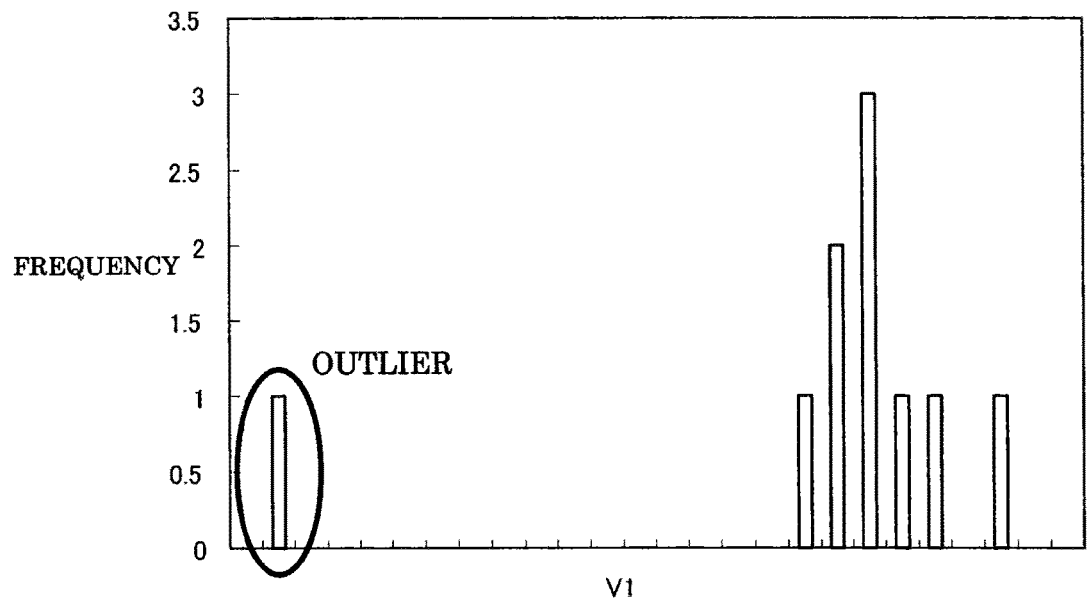
FIG. 20 is a graph for explaining the fourth embodiment and indicating a distribution when measured voltage phasor quantities have an outlier.

In those figures, FIG. 19 illustrates a distribution having no outlier of the voltage phasor quantity, while FIG. 20 illustrates a distribution having an outlier of the voltage phasor quantity. The outlier is data extraordinary dissociated with other distributions due to an accidental system fluctuation, etc. Such an outlier can be detected through a statistical process like the Smirnov-Grubbs test. When, like FIG. 20, the distribution of the estimation data set $V_{1k}$, $I_{1k}$, $V_{2k}$, $I_{2k}$ (where k=1, 2, . . . , n) contains the outlier from other measured values, the data-set creating block 91 eliminates the outlier and creates the data set $V_{1k}$, $I_{1k}$, $V_{2k}$, $I_{2k}$ (where k=1, 2, . . . , n), and supplies the estimation data set to the backward impedance estimating block 93.

[Advantageous Effects]

According to the above-explained fourth embodiment, in the data-set creating step S103 by the data-set creating block 91, the outlier in the data set $V_{1k}$, $I_{1k}$, $V_{2k}$, $I_{2k}$ (where k=1, 2, n) is eliminated in advance, and thus the adverse effect due to an accidental system fluctuation can be eliminated. Hence, the estimation precision of the backward impedance $Z_{sys}$ can be enhanced, and the calculation error can be reduced. Therefore, the short-circuit capacity can be always precisely obtained.

(5) Fifth Embodiment

[Configuration]

Next, a fifth embodiment of the present disclosure will be explained with reference to FIGS. 21 and 22.

The fifth embodiment eliminates the outlier during the arithmetic processing like the fourth embodiment, but eliminates an outlier in a short-circuit capacity $P_{sc}$ or the short-circuit current $I_{sc}$ in the short-circuit capacity calculating step S106, not eliminating the outlier in the data-set creating step S103.

Figure 21A:
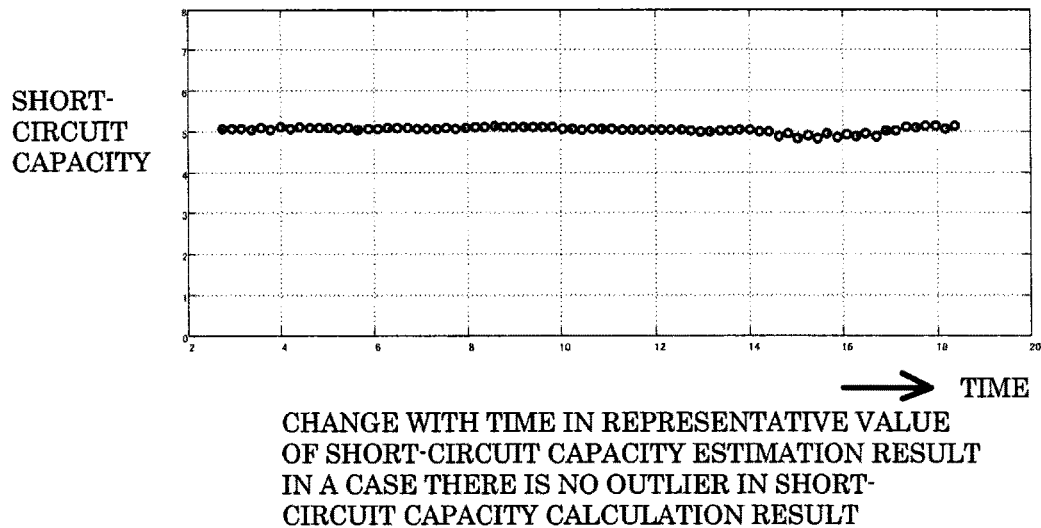
Figure 21B:
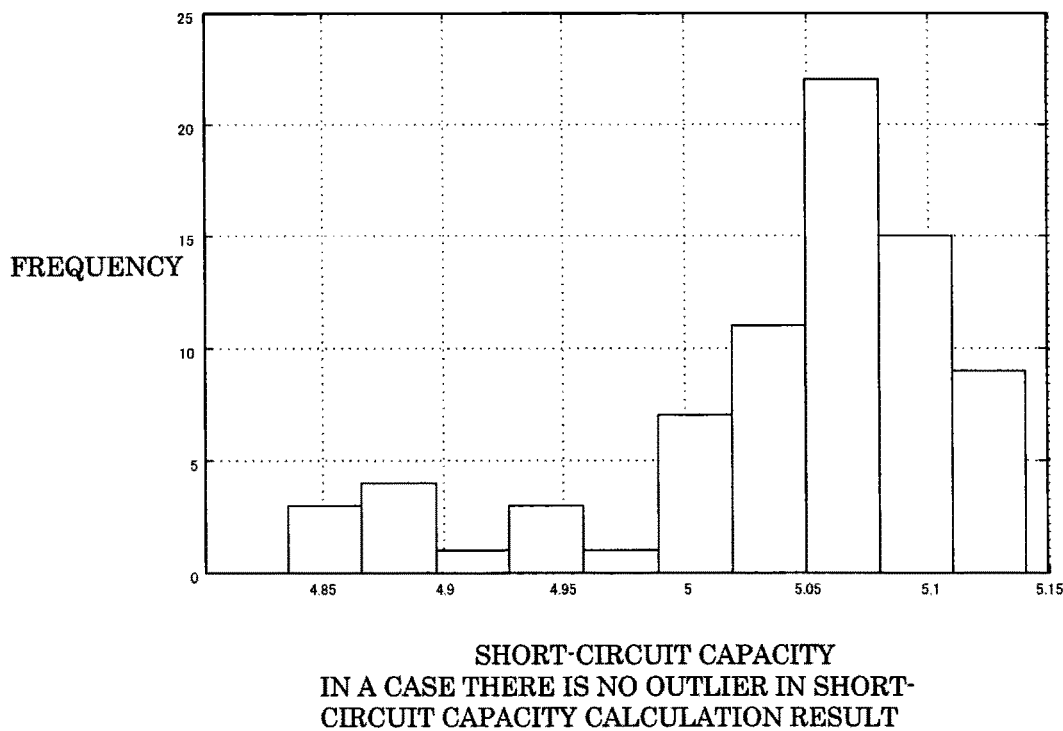
Figure 22A:
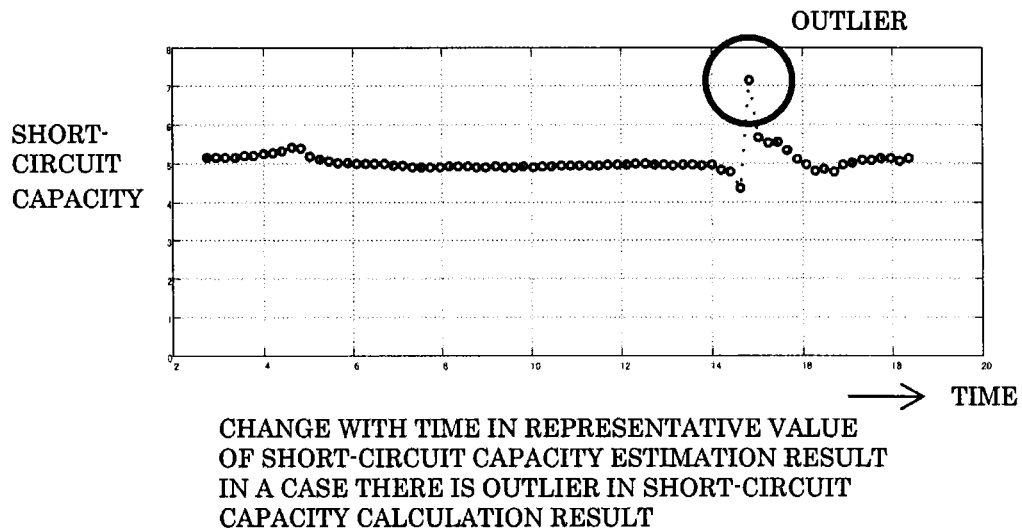
FIG. 22 is a graph for explaining the fifth embodiment and is a graph indicating a distribution when measured short-circuit capacities have an outlier and measured voltage phasor quantities have an outlier.
Figure 22B:
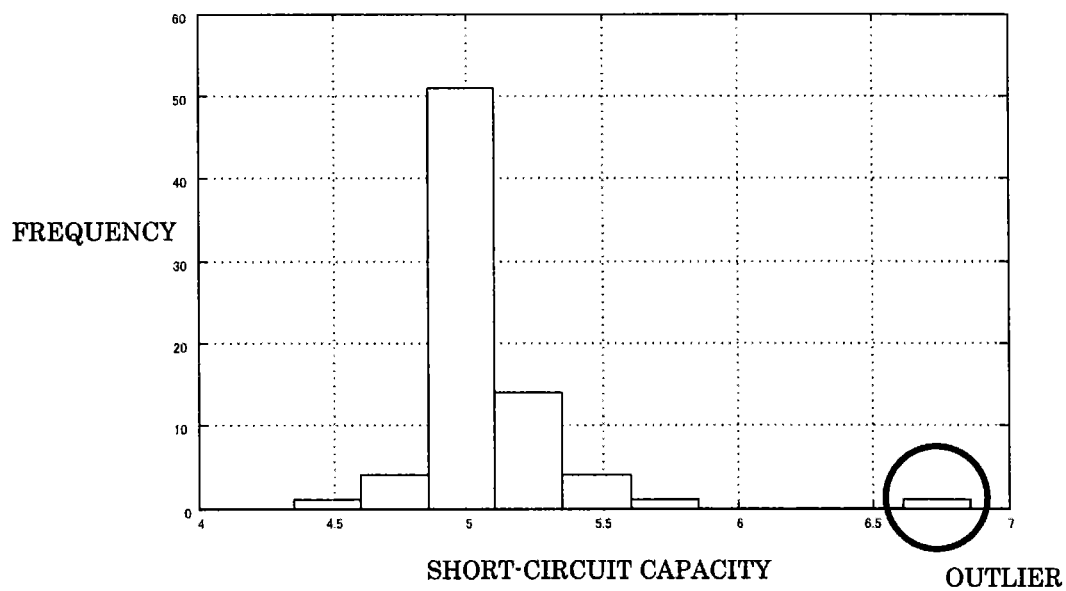

The conceptual diagrams of FIGS. 21, 22 illustrate a calculation result of the short-circuit capacity $P_{sc}$ for each time (upper FIGS. 21A, 22A) and a distribution of the short-circuit capacity $P_{sc}$ for a certain time period (lower FIGS. 21B, 22B). By repeating the short-circuit calculating step S106 by the short-circuit capacity calculating block 94, a change in the short-circuit capacity $P_{sc}$ with time can be visible. FIGS. 21A and 21B illustrate a case in which no outlier of the short-circuit capacity $P_{sc}$ is present, while FIGS. 22A, 22B illustrate a case in which an outlier of the short-circuit capacity $P_{sc}$ is present.

Ina short-circuit capacity calculation through the execution of the short-circuit capacity calculating step S106, a distribution of the short-circuit capacity $P_{sc}$ can be obtained. Hence, a representative value (e.g., a center value of the distribution, the most frequent value, or an average value) is calculated and plotted. Next, the representative value of the short-circuit capacity $P_{sc}$ for a certain time period has a distribution. At this time, as illustrated in FIG. 22B, when the distribution of the short-circuit capacity calculations contains an outlier from other measured values, such an outlier is eliminated. A detection of the outlier is enabled upon execution of the statistical process like the Smirnov-Grubbs test as well as the fourth embodiment.

[Advantageous Effects]

According to the above-explained fifth embodiment, the outlier short-circuit capacity $P_{sc}$ is eliminated in the short-circuit capacity calculating step by the short-circuit capacity calculating block 94, and thus adverse effects due to an accidental system fluctuation and a sudden change can be surely eliminated.

(6) Sixth Embodiment

[Configuration]

Figure 23:
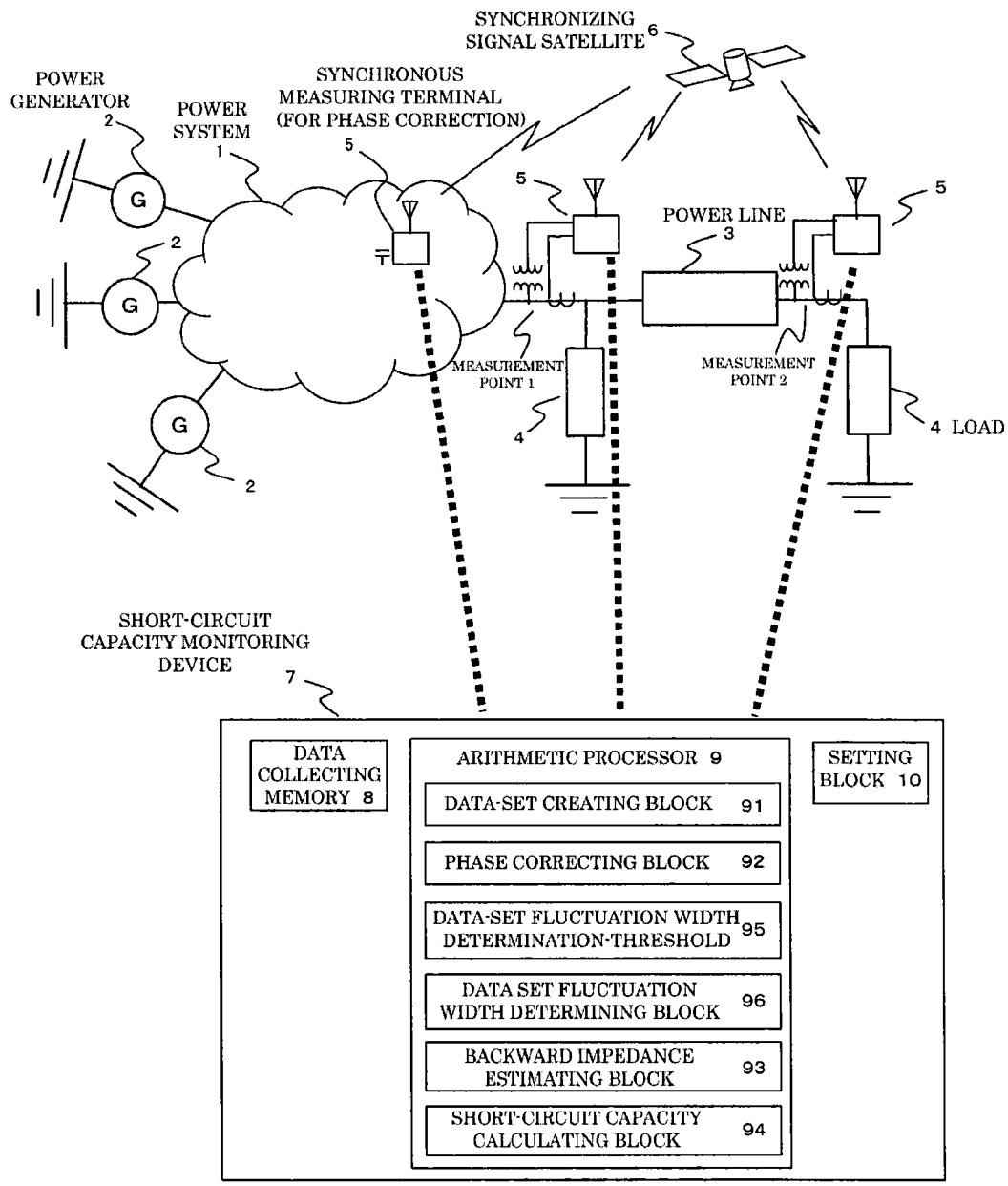
FIG. 23 is a configuration diagram for a sixth embodiment of the present disclosure.
Figure 24:
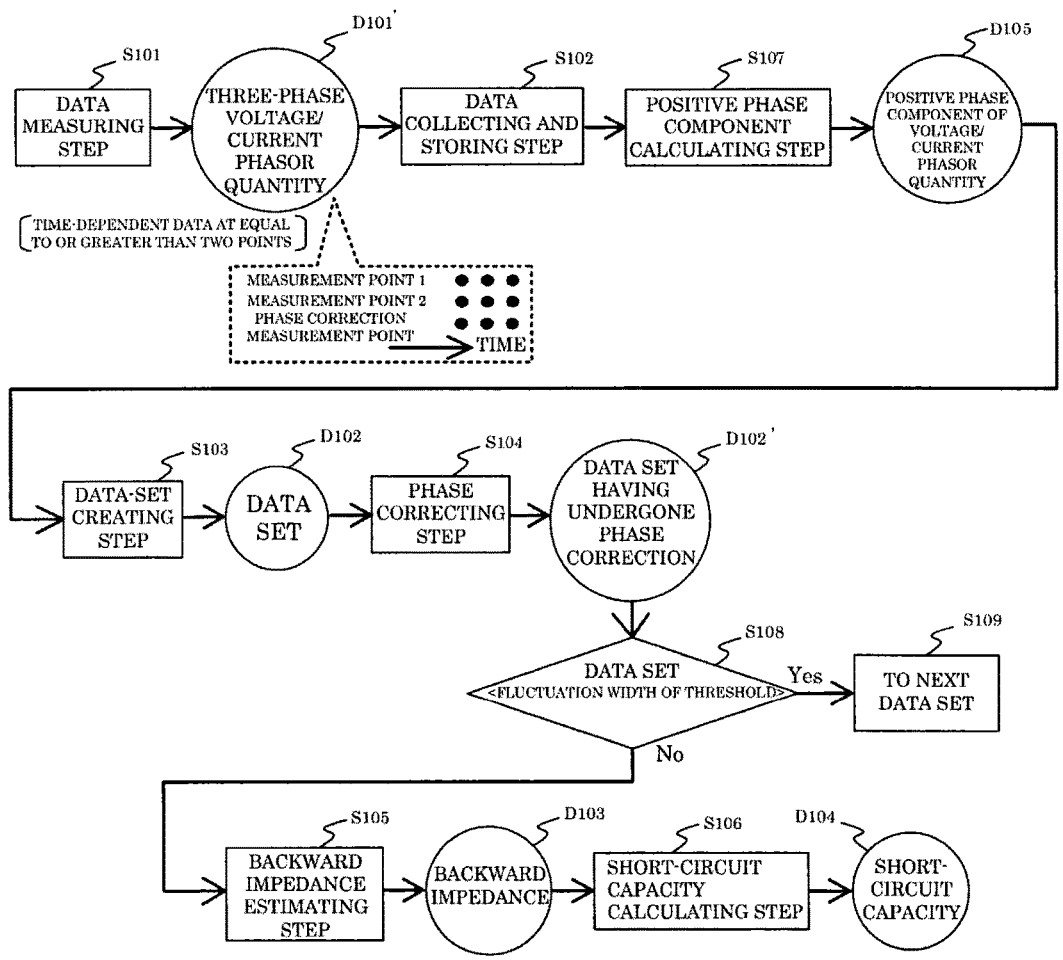
FIG. 24 is a diagram illustrating a process flow in the sixth embodiment.

Next, a sixth embodiment of the present disclosure will be explained with reference to FIGS. 23 to 25. FIG. 23 is a configuration diagram of the sixth embodiment, and FIG. 24 illustrates an example process procedure of the sixth embodiment. FIG. 25 is a diagram for explaining a selecting method of a threshold for determining a fluctuation width according to the sixth embodiment.

As illustrated in FIG. 23, the feature of the sixth embodiment is that the arithmetic processor 9 of the short-circuit capacity monitoring device 7 is provided with a determination-threshold setting block 95 and a fluctuation-width determining block 96. As illustrated in FIG. 24, the determination-threshold setting block 95 sets a determination threshold D105 that is a determination reference to exclude an estimation result (determination-threshold setting step S108). The determination-threshold setting block 95 may obtain the determination threshold D105 through a calculation beforehand, or may utilize a set value.

The fluctuation-width determining block 96 determines whether or not the fluctuation width of the data set D102' having undergone the phase correction is smaller than the determination threshold D105 based on the determination threshold D105 set by the determination-threshold setting block 95 (fluctuation-width determining step S109). The fluctuation width of the data set D102' having undergone the phase correction is a width of the data set D102 fluctuated through the phase correcting step S104 in which the data set D102 is created through the data-set creating step S103. The fluctuation-width determining step S109 is executed between the phase correcting step S104 and the backward impedance estimating step S105.

In the fluctuation-width determining step S109, when it is determined that the fluctuation width of the data set D102' having undergone the phase correction is smaller than the determination threshold D105 (S109: YES), the process progresses to next data-set creating step S110 without executing the backward impedance estimating step S105 and the short-circuit capacity calculating step S106. Conversely, when it is determined that the fluctuation width of the data set D102' having undergone the phase correction is equal to or larger than the determination threshold D105 (S109: NO), the process progresses to the backward impedance estimating step S105.

Figure 25A:
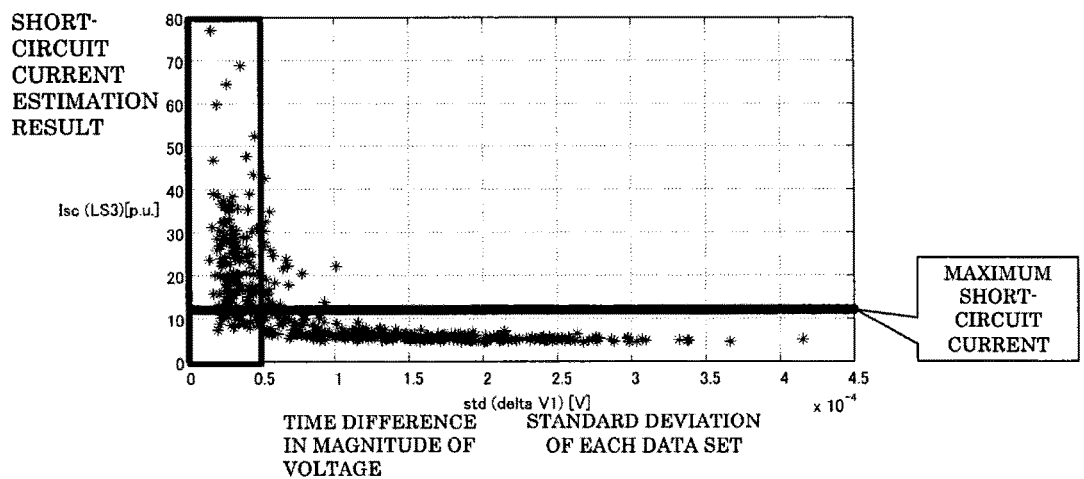
FIG. 25 is a diagram for explaining a selecting method of a threshold for determining a fluctuation width in the sixth embodiment.
Figure 25B:
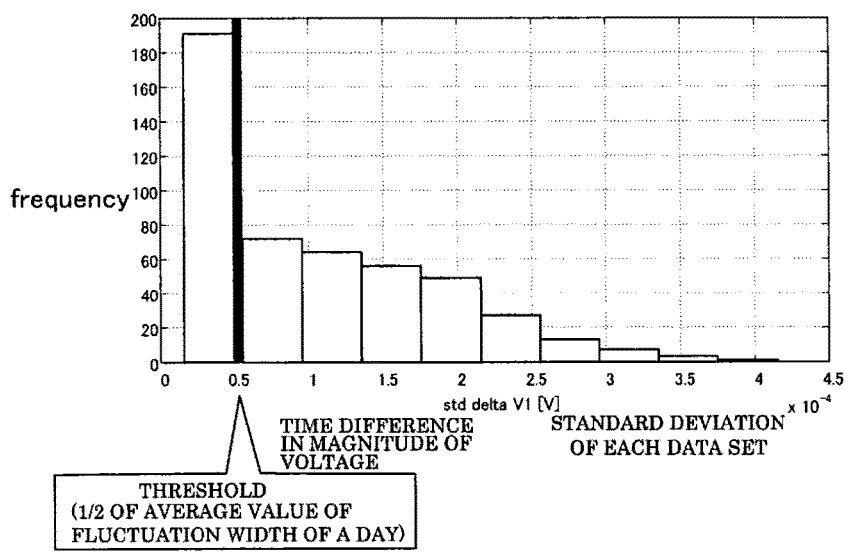

An explanation will be given of an example method of setting the determination threshold D105 with reference to FIGS. 25A and 25B. FIG. 25A is a diagram having the horizontal axis representing a time difference of the absolute value of the voltage data set $V_{11}, \ldots V_{1n}$ at a measurement point 1, i.e., a standard deviation of $V_{11}$-$V_{12}$, $V_{12}$-$V_{13}$, . . . , $V_{1n-1}$-$V_{1n}$, and having the vertical axis representing the short-circuit current estimated value. FIG. 25B is a diagram illustrating a histogram of the standard deviation of the time difference of the absolute value of the voltage data set $V_{11}, \ldots V_{1n}$ at the measurement point 1. The horizontal axis is the same as that of FIG. 25A. FIGS. 25A and 25B illustrate an estimation result of a day at a cycle of three minutes. Since the voltage is a phasor quantity, the fluctuation width is calculated using the absolute value. As the voltage fluctuation width, in this example, the standard deviation is applied.

The short-circuit current estimation value becomes a large outlier when the voltage standard deviation is small. Hence, when the voltage standard deviation is smaller than the determination threshold D105, the process does not progress to the backward impedance estimating step S105, but progresses to the next data-set creating step S110. In this case, as the determination threshold D105, a half of the average of the voltage standard deviation of a day is applied.

In FIGS. 25A and 25B, the explanation was given of an example case in which the fluctuation width of the data set D102' is the voltage fluctuation width, but the determination can be carried out based on the fluctuation width of the current. In addition, by performing AND operation of an exclusion result upon determination on the basis of the voltage fluctuation and a determination result based on the fluctuation width of the current, the variation of the estimation result can be further surely suppressed.

[Advantageous Effects]

According to the above-explained sixth embodiment, as to the fluctuation width of the data set D102' having undergone the phase correction, if it is smaller than the determination threshold D105, no estimation of the backward impedance is performed. Hence, the variation of the estimation result itself can be reduced. Therefore, the estimation precision of the backward impedance $Z_{sys}$ can be further improved, and the calculation error can be further reduced.

(7) Seventh Embodiment

[Configuration]

Figure 26:
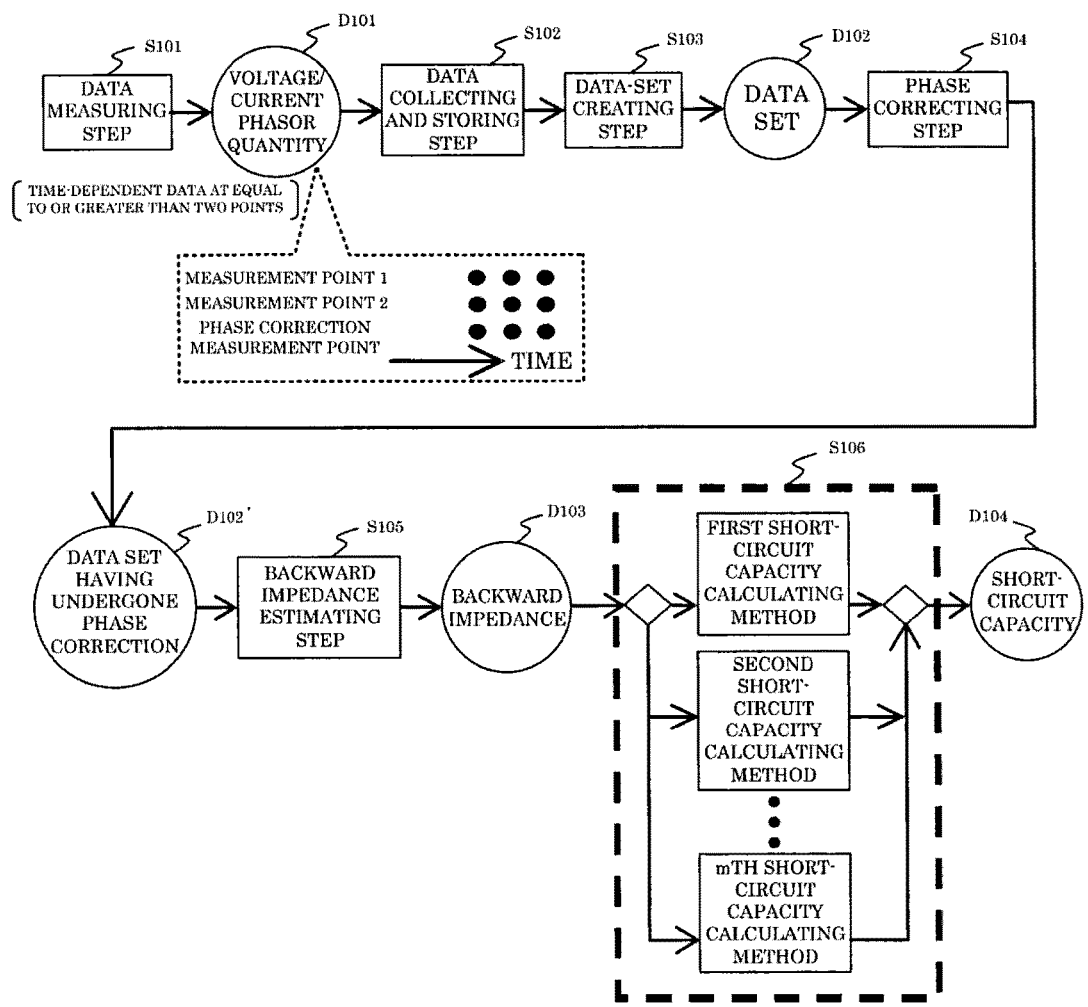
FIG. 26 is a diagram illustrating a process flow according to a seventh embodiment of the present disclosure.

A seventh embodiment of the present disclosure will be explained with reference to FIG. 26. FIG. 26 is a diagram illustrating a process flow of the seventh embodiment.

As illustrated in FIG. 26, in the seventh embodiment, in the short-circuit capacity calculating step S106 by the short-circuit capacity calculating block 94, multiple short-circuit capacity calculating methods 1 to m with different characteristics are prepared, and one of the multiple short-circuit capacity calculating methods 1 to m is selected based on a determination criteria set in advance. At this time, as the determination criteria of the calculation method, multiple criteria, such as the condition of the system configuration, the magnitude of the short-circuit capacity $P_{sc}$, a time change in the short-circuit capacity $P_{sc}$, and a tiny fluctuation width of the system, can be set.

For example, five short-circuit capacity calculating methods are prepared, and it is presumed that a first calculating method is the most general calculating method. The second calculating method has a characteristic flexible with the tiny fluctuation of the system, and the third calculating method is effective when there is a load between measurement points. In addition, the fourth calculating method is compatible with a time change in the short-circuit capacity $P_{sc}$, and the fifth calculating method is effective when the short-circuit capacity $P_{sc}$ is small.

According to those first to fifth calculating methods, the first calculating method is set as a default, and the determination criteria of selecting the second to fifth calculating methods are as follow. That is, for the second calculating method, a threshold δ of the tiny fluctuation, for the third calculating method, presence of a load, for a fourth calculating method, presence or absence of a time change in the short-circuit capacity $P_{sc}$, and for the fifth calculating method, a threshold $P_{scX}$ of the short-circuit capacity $P_{sc}$.

That is, when the system tiny fluctuation is smaller than the threshold δ, or when there is no load between the measurement points, or when the short-circuit capacity $P_{sc}$ is constant, or when the short-circuit capacity $P_{sc}$ is larger than the threshold $P_{scX}$, the first short-circuit capacity calculating method is applied to the short-circuit capacity calculating step S105 by the short-circuit capacity calculating block 94.

In contrast, when the system tiny fluctuation is larger than the threshold δ, the second calculating method is applied. In addition, when there is a load between the measurement points, the third calculating method is applied, and when the short-circuit capacity $P_{sc}$ has a time change, the fourth calculating method is applied. Still further, when the short-circuit capacity $P_{sc}$ is smaller than the threshold $P_{scX}$, the fifth calculating method is applied.

When the criteria for applying the second to fifth calculating methods are simultaneously satisfied, the preference is given to each calculating method in the order of second, third, fourth, and fifth calculating methods, and only one calculating method is applied. When, for example, the system tiny fluctuation is larger than the threshold δ and there is a load between the measurement points, the criteria for applying the second and third calculating methods are satisfied. In this case, only the second calculating method is applied.

Moreover, when the short-circuit capacity $P_{sc}$ has a time change, and the short-circuit capacity $P_{sc}$ is smaller than the threshold $P_{scX}$, the criteria for applying the fourth and fifth calculating methods are satisfied. In this case, only the fourth calculating method is applied. Multiple calculating methods among the first to fifth calculating methods may be applied to obtain multiple short-circuit capacities $P_{sc}$ instead of applying only one calculating method, and one of the short-circuit capacities $P_{sc}$ can be eventually selected.

[Advantageous Effects]

According to the above-explained seventh embodiment, in addition to the advantageous effects of the aforementioned embodiments, a unique advantageous effect that enables a highly precise calculation of the short-circuit capacity can be accomplished by applying the optimized calculating method in accordance with the system condition.

(8) Eighth Embodiment

[Configuration]

Figure 27:
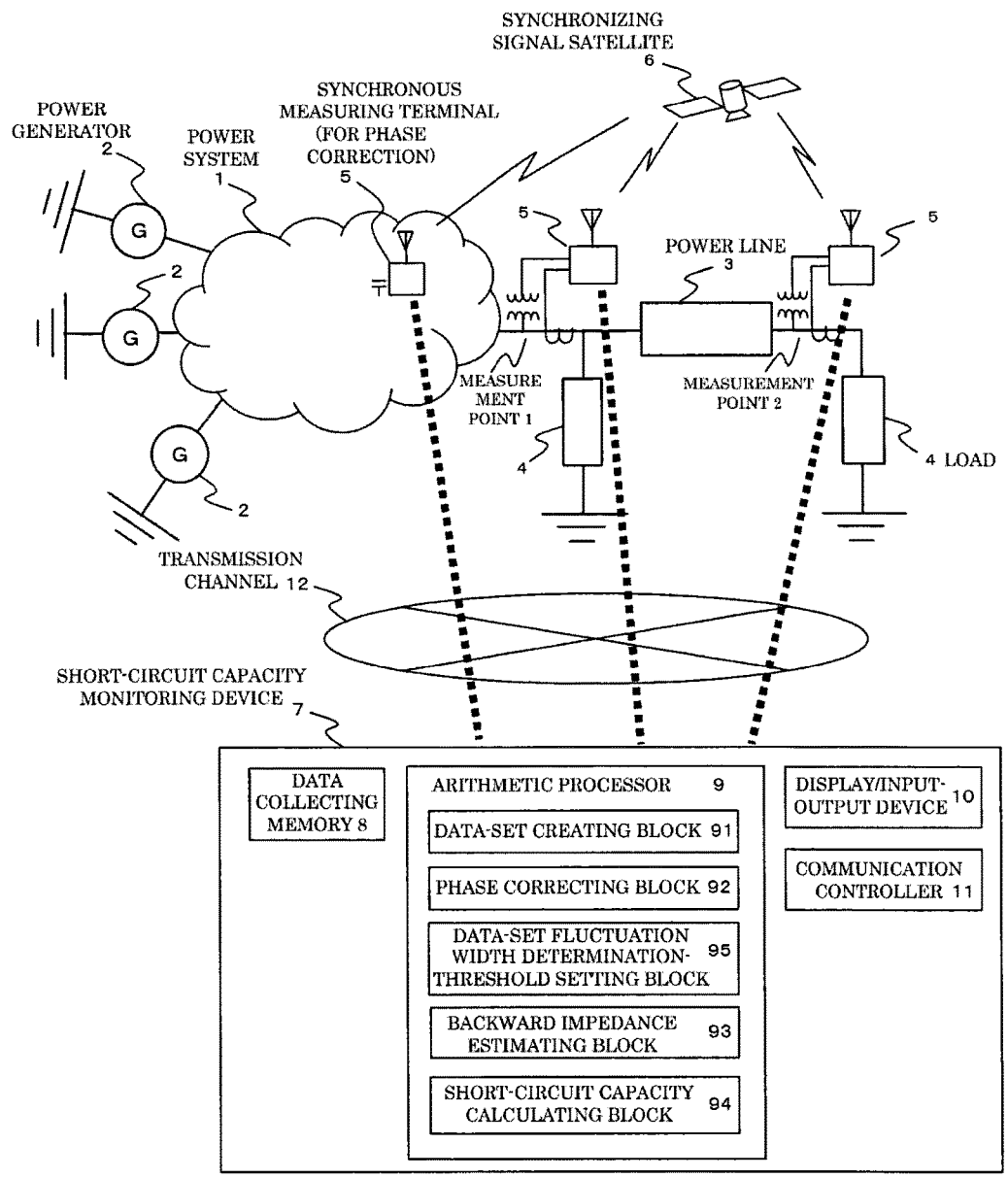
FIG. 27 is a configuration diagram according to an eighth embodiment of the present disclosure.
Figure 28:
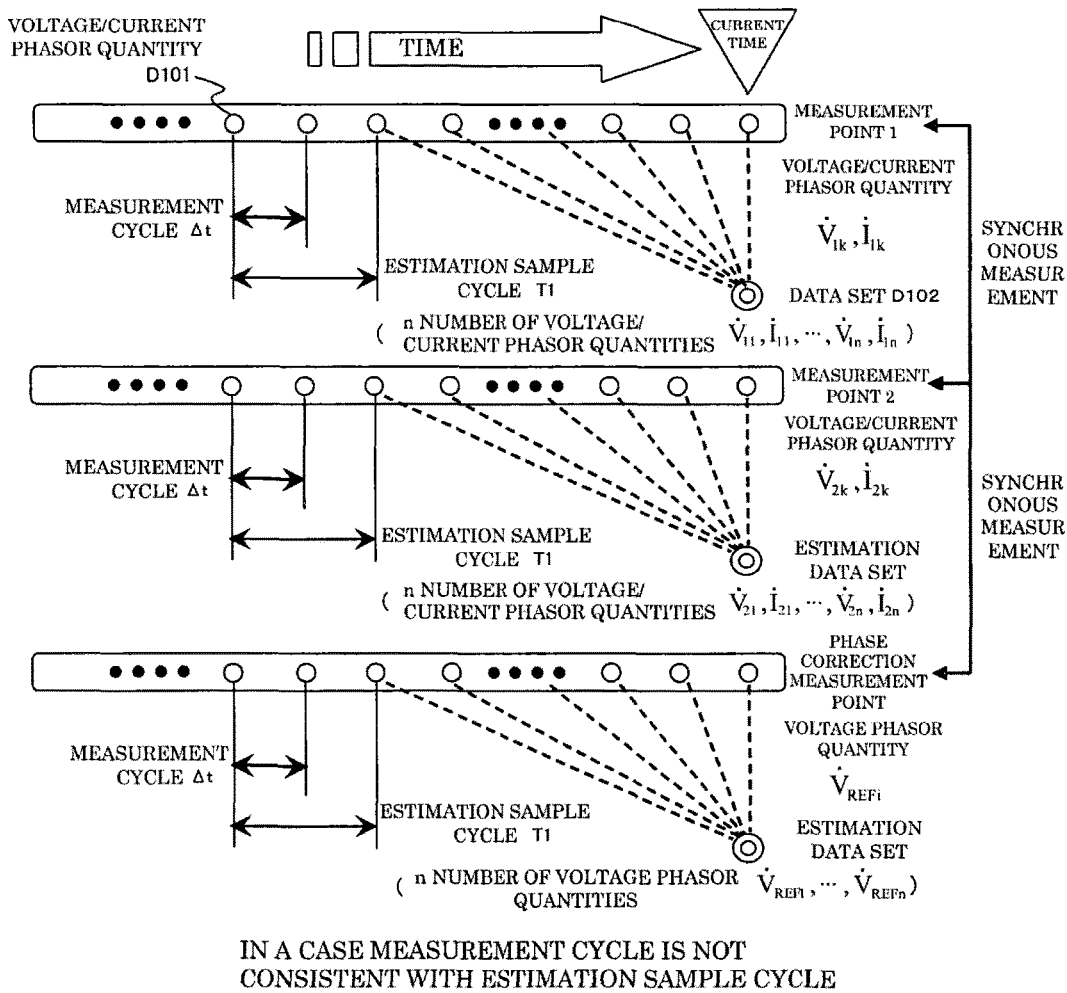
FIG. 28 is an explanatory diagram for a process of creating an estimation data set based on a voltage/current phasor quantity at each measurement point in another embodiment of the present disclosure.

An eighth embodiment of the present disclosure will be explained with reference to FIG. 27. FIG. 27 is a configuration diagram of the eighth embodiment. As illustrated in FIG. 27, according to the short-circuit capacity monitoring system of the eighth embodiment, the short-circuit capacity monitoring device 7 includes a communication controller 11, and collects on-line the voltage and the current phasor quantity from the synchronous measuring terminal 5 through a transmission channel 12.

[Advantageous Effects]

According to the eighth embodiment employing the above-explained configuration, using the voltage and the current phasor quantities obtained by online measuring, the estimation of the short-circuit capacity can be performed sequentially. Hence, the short-circuit capacity can be always and continuously monitored, contributing an improvement of the reliability of the power system.

(9) Other Embodiments

The present disclosure is not limited to the aforementioned embodiments, and the number of installed synchronous measuring terminals and the configuration of the short-circuit capacity monitoring device can be changed as needed. For example, in the first embodiment, the estimation sample cycle T1 of the estimation data set D102 is set to be equal to the measurement cycle Δt, but it is fine if the estimation sample cycle T1 is not equal to the measurement cycle Δt, and as illustrated in FIG. 21, a setting can be made as an estimation sample cycle T1 is greater than a measurement cycle T0. It is possible to create the data set D102 containing n number of data for each estimation sample cycle T1 in this way.

REFERENCE SIGNS LIST

1 Power system
2 Power generator
3 Power line
4 Load
5 Synchronous measuring terminal
6 Synchronizing signal satellite
7 Short-circuit capacity monitoring device
8 Data collecting memory
9 Arithmetic processor
91 Data-set creating block
92 Phase correcting block
93 Backward impedance estimating block
94 Short-circuit capacity calculating block
95 Determination-threshold setting block
96 Fluctuation-width determining block
10 Display/input-output device
11 Communication controller
12 Transmission channel

The invention claimed is:

1. A method for monitoring a short-circuit capacity of a power system, the method comprising:

measuring data synchronously with time, by using a synchronizing signal transmitted from a synchronizing signal satellite, of phasor quantities of a voltage and a current at each of at least two synchronous measuring terminals on a power line of the power system, and a phasor quantity of a voltage at a synchronous measuring terminal for a phase correction connected to the synchronous measuring terminals via the power line of the power system;

collecting data of a short-circuit capacity monitoring device collecting measured data measured by the synchronous measuring terminals and by the synchronous measuring terminal for the phase correction in the data measuring;

a data-set creating of the short-circuit capacity monitoring device creating, for each predetermined cycle, a data set of the at least two synchronous measuring terminals and a data set of the synchronous measuring terminal for the phase correction, both containing a plural pieces of data based on the measured data collected in the data collecting;

a phase correcting of the short-circuit capacity monitoring device correcting a phase of the data set of the at least two synchronous measuring terminals by subtracting a voltage phase of the synchronous measuring terminal for the phase correction from the phase of the data set of the at least two synchronous measuring terminals, defining a voltage phase at a certain time and at any one of the synchronous measuring terminals as a reference phase, and subtracting the reference phase from the phase of the data set of the at least two synchronous measuring terminals which has the voltage phase of the synchronous measuring terminal for the phase correction subtracted therefrom;

a backward impedance estimating of the short-circuit capacity monitoring device estimating a backward impedance on a power-source side as viewed from a short-circuit point using the data set of the at least two synchronous measuring terminals having undergone the phase correction in the phase correcting; and a short-circuit capacity calculating of calculating a short-circuit capacity based on the backward impedance estimated in the backward impedance estimating.

2. The power-system short-circuit capacity monitoring method according to claim 1, wherein in the data-set creating, a sample cycle and a number of pieces of data contained in the data set of the at least two synchronous measuring terminals and the data set of the synchronous measuring terminal for the phase correction are set as changeable in accordance with a system fluctuation condition.

3. The power-system short-circuit capacity monitoring method according to claim 1, wherein in the data-set creating, an outlier in the data set of the at least two synchronous measuring terminals and the data set of the synchronous measuring terminal for the phase correction is excluded.

4. The power-system short-circuit capacity monitoring method according to claim 1, wherein in the short-circuit capacity calculating, an outlier in the short-circuit capacity or a short-circuit current which have been calculated is excluded.

5. The power-system short-circuit capacity monitoring method according to claim 1, further comprising:

a determination-threshold setting of setting a determination threshold that is a determination criterion for excluding a result of backward impedance estimating; and a fluctuation-width determining of determining whether or not a fluctuation width of the data set of the at least two synchronous measuring terminals caused by the phase correction in the phase correcting is smaller than the determination threshold, wherein in the fluctuation-width determining, when it is determined that the fluctuation width of the data set of the at least two synchronous measuring terminals is smaller than the determination threshold, the power-system short-circuit capacity monitoring method progresses to a next data-set creating without executing the backward impedance estimating and the short-circuit capacity calculating, and when it is determined that the fluctuation width of the data set of the at least two synchronous measuring terminals is larger than the determination threshold, the power-system short-circuit capacity monitoring method progresses to the backward impedance estimating.

6. The power-system short-circuit capacity monitoring method according to claim 1, further comprising a communication of on-line collecting the phasor quantity of a voltage and a current collected in the data collecting, wherein in the short-circuit capacity calculating, the short-circuit capacity or a short-circuit current is calculated sequentially.

7. A system that monitors a short-circuit capacity of a power system, the system comprising:

a data measurer measuring synchronously with time, by using a synchronizing signal transmitted from a synchronizing signal satellite, a phasor quantity of a voltage and a current at each of at least two synchronous measuring terminals on a power line of the power system, and a phasor quantity of a voltage at a synchronous measuring terminal for a phase correction connected to the synchronous measuring terminals via the power line of the power system;

a data collector in a short-circuit capacity monitoring device collecting measured data measured by the data measurer by the synchronous measuring terminals and by the synchronous measuring terminal for the phase correction;

a data-set creator in the short-circuit capacity monitoring device creating, for each predetermined cycle, a data set of the at least two synchronous measuring terminals and the data set of the synchronous measuring terminal for the phase correction, both containing a plural pieces of data based on the measured data collected by the data collector;

a phase corrector in the short-circuit capacity monitoring device correcting a phase of the data set of the at least two synchronous measuring terminals by subtracting a voltage phase of the synchronous measuring terminal for the phase correction from the phase of the data set of the at least two synchronous measuring terminals, defining a voltage phase at a certain time and at certain synchronous measuring terminals as a reference phase, and subtracting the reference phase from the phase of the data set of the at least two synchronous measuring terminals;

a backward impedance estimator in the short-circuit capacity monitoring device estimating a backward impedance on a power-source side as viewed from a short-circuit point using the data set of the at least two synchronous measuring terminals having undergone the phase correction by the phase corrector; and a short-circuit capacity calculator calculating a short-circuit capacity based on the backward impedance estimated by the backward impedance estimator.

8. The power-system short-circuit capacity monitoring method according to claim 2, wherein in the data-set creating, an outlier in the data set of the at least two synchronous measuring terminals and the data set of the synchronous measuring terminal for the phase correction is excluded.

9. The power-system short-circuit capacity monitoring method according to claim 2, wherein in the short-circuit capacity calculating, an outlier in the short-circuit capacity or a short-circuit current which have been calculated is excluded.

10. The power-system short-circuit capacity monitoring method according to claim 3, wherein in the short-circuit capacity calculating, an outlier in the short-circuit capacity or a short-circuit current which have been calculated is excluded.

11. The power-system short-circuit capacity monitoring method according to claim 2, further comprising:

a determination-threshold setting of setting a determination threshold that is a determination criterion for excluding a result of backward impedance estimating; and a fluctuation-width determining of determining whether or not a fluctuation width of the data set of the at least two synchronous measuring terminals caused by the phase correction in the phase correcting is smaller than the determination threshold, wherein in the fluctuation-width determining, when it is determined that the fluctuation width of the data set of the at least two synchronous measuring terminals is smaller than the determination threshold, the power-system short-circuit capacity monitoring method progresses to a next data-set creating without executing the backward impedance estimating and the short-circuit capacity calculating, and when it is determined that the fluctuation width of the data set of the at least two synchronous measuring terminals is larger than the determination threshold, the power-system short-circuit capacity monitoring method progresses to the backward impedance estimating.

12. The power-system short-circuit capacity monitoring method according to claim 3, further comprising:

a determination-threshold setting of setting a determination threshold that is a determination criterion for excluding a result of backward impedance estimating; and a fluctuation-width determining of determining whether or not a fluctuation width of the data set of the at least two synchronous measuring terminals caused by the phase correction in the phase correcting is smaller than the determination threshold, wherein in the fluctuation-width determining, when it is determined that the fluctuation width of the data set of the at least two synchronous measuring terminals is smaller than the determination threshold, the power-system short-circuit capacity monitoring method progresses to a next data-set creating without executing the backward impedance estimating and the short-circuit capacity calculating, and when it is determined that the fluctuation width of the data set of the at least two synchronous measuring terminals is larger than the determination threshold, the power-system short-circuit capacity monitoring method progresses to the backward impedance estimating.

13. The power-system short-circuit capacity monitoring method according to claim 4, further comprising:

a determination-threshold setting of setting a determination threshold that is a determination criterion for excluding a result of backward impedance estimating; and a fluctuation-width determining of determining whether or not a fluctuation width of the data set of the at least two synchronous measuring terminals caused by the phase correction in the phase correcting is smaller than the determination threshold, wherein in the fluctuation-width determining, when it is determined that the fluctuation width of the data set of the at least two synchronous measuring terminals is smaller than the determination threshold, the power-system short-circuit capacity monitoring method progresses to a next data-set creating without executing the backward impedance estimating and the short-circuit capacity calculating, and when it is determined that the fluctuation width of the data set of the at least two synchronous measuring terminals is larger than the determination threshold, the power-system short-circuit capacity monitoring method progresses to the backward impedance estimating.

14. The power-system short-circuit capacity monitoring method according to claim 2, further comprising a communication of on-line collecting the phasor quantity of a voltage and a current collected in the data collecting,
wherein in the short-circuit capacity calculating, the short-circuit capacity or a short-circuit current is calculated sequentially.

15. The power-system short-circuit capacity monitoring method according to claim 3, further comprising a communication of on-line collecting the phasor quantity of a voltage and a current collected in the data collecting,
wherein in the short-circuit capacity calculating, the short-circuit capacity or a short-circuit current is calculated sequentially.

16. The power-system short-circuit capacity monitoring method according to claim 4, further comprising a communication of on-line collecting the phasor quantity of a voltage and a current collected in the data collecting,
wherein in the short-circuit capacity calculating, the short-circuit capacity or a short-circuit current is calculated sequentially.

17. The power-system short-circuit capacity monitoring method according to claim 5, further comprising a communication of on-line collecting the phasor quantity of a voltage and a current collected in the data collecting,
wherein in the short-circuit capacity calculating, the short-circuit capacity or a short-circuit current is calculated sequentially.

* * * * *